(12) United States Patent
Takeuchi et al.

(10) Patent No.: US 7,253,754 B2
(45) Date of Patent: Aug. 7, 2007

(54) DATA FORM CONVERTER BETWEEN SERIAL AND PARALLEL

(75) Inventors: Masahiro Takeuchi, Tokyo (JP); Takanori Saeki, Kanagawa (JP); Kenichi Tanaka, Kanagawa (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 109 days.

(21) Appl. No.: 10/842,388

(22) Filed: May 10, 2004

(65) Prior Publication Data

US 2004/0222826 A1 Nov. 11, 2004

(30) Foreign Application Priority Data

May 9, 2003 (JP) ............................. 2003-132078

(51) Int. Cl.
*H03M 9/00* (2006.01)
(52) U.S. Cl. ...................... 341/100; 341/101; 375/368
(58) Field of Classification Search ................ 341/100, 341/101; 370/476, 503, 506; 375/368
See application file for complete search history.

(56) References Cited

U.S. PATENT DOCUMENTS

| | | | |
|---|---|---|---|
| 4,710,922 A * | 12/1987 | Scott ........................... | 341/100 |
| 5,327,434 A | 7/1994 | Kubo | |
| 5,490,147 A * | 2/1996 | Kubo ........................... | 370/509 |
| 5,706,438 A | 1/1998 | Choi et al. | |
| 5,757,807 A | 5/1998 | Tezuka et al. | |
| 5,907,719 A | 5/1999 | Nimishakavi | |
| 5,982,309 A | 11/1999 | Xi et al. | |
| 6,169,501 B1 * | 1/2001 | Ryan .......................... | 341/101 |
| 6,252,527 B1 | 6/2001 | Yang | |
| 6,388,590 B1 * | 5/2002 | Ng ............................. | 341/100 |

FOREIGN PATENT DOCUMENTS

| | | |
|---|---|---|
| EP | 0 561 039 A1 | 9/1993 |
| JP | H07-231260 | 8/1995 |
| JP | 8-65173 | 3/1996 |
| JP | 11-98101 | 4/1999 |
| JP | H13-267932 | 9/2001 |
| JP | 2002-217742 | 8/2002 |

OTHER PUBLICATIONS

Patent Abstracts of Japan No. 2002-217742 dated Aug. 2, 2002.

* cited by examiner

*Primary Examiner*—Howard L. Williams
(74) *Attorney, Agent, or Firm*—Scully, Scott, Murphy & Presser, P.C.

(57) ABSTRACT

A data form converter allowing parallel-to-serial or serial-to-parallel conversion at various conversion ratios is disclosed. A frequency divider divides an input clock in frequency at a variable frequency division ratio to produce a single frequency-divided clock. A data shift circuit shifts serial input data according to the input clock to output n-bit parallel data, where n is determined depending on the variable frequency division ratio. A retiring section synchronizes the n-bit parallel data with the single frequency-divided clock to output parallel output data.

14 Claims, 18 Drawing Sheets

DATA FORM CONVERTER BETWEEN SERIAL AND PARALLEL

BACKGROUND OF THE INVENTION

1. Field of the Invention

The present invention relates to a data form converter, which converts data form from serial to parallel or from parallel to serial.

2. Description of the Related Art

LSI (Large Scale Integration) technology has been remarkably developed, so that an operating clock in an LSI has been increased to several hundred megahertz (MHz) and a signal transmission rate between LSIs has been increased to several gigabits per second (Gbps). However, a difference between an operating speed in an LSI and the signal transmission rate between LSIs is large. In order to allow an LSI to output/input data to/from outside, a parallel-to-serial (hereinafter, denoted by "parallel-serial") converter may be provided at an output stage of the LSI so as to convert low-speed parallel data in the LSI into high-speed serial data, allowing the high-speed serial data to be output from the LSI to the outside. Moreover, by providing a serial-to-parallel (hereinafter, denoted by "serial-parallel") converter at an input stage of the LSI, high-speed serial data can be input from the outside to the inside of the LSI.

In order to meet demands regarding data input and output between the LSI and the outside of the LSI, several serial-parallel converters for converting serial data into parallel data and several parallel-serial converters for converting parallel data into serial data have been proposed.

Japanese patent application Unexamined Publication No. 11-98101 discloses a serial-parallel converter having a plurality of 1:2 demultiplexer (DEMUX) modules connected in a multistage tree structure (see paragraphs [0016] and [00171], and FIGS. 4 and 5). In each stage, serial data is converted into parallel data at a specific conversion ratio such as 1:2, 1:4, 1:8, or 1:16. Thus, it is possible to perform serial-parallel conversion at a conversion ratio of 2 to the n-th power, wherein n is an integer greater than 0. Such a conventional serial-parallel converter, however, cannot convert serial data to parallel data at a ratio other than the ratio of 1:2$^n$.

Japanese Patent application Unexamined Publication No. 2002-217742 discloses a serial-parallel converter having a first-stage 1:2 serial-parallel converter, two second-stage conversion sections, and a retiming circuit. The first-stage 1:2 serial-parallel converter divides an input serial data signal into an odd-number channel data signal and an even-number channel data signal, which are supplied to respective ones of the second-stage conversion sections. Each of the second-stage conversion sections includes two 1:2 serial-parallel converters and a flip-flop circuit, which are each supplied with different-phase clocks generated by a frequency divider (see paragraphs [0013]–[0015] and FIG. 1). The output data signals of the second-stage conversion sections enter theretiming circuit to produce a parallel data signal.

In addition, the frequency divider is connected to an on/off switch, by which the frequency divider is allowed to divide an input clock at a selected one of two frequency-division ratios. In other words, the serial-parallel converter can selectively-set two frequency-division ratios by turning the on/off switch on or off. Accordingly, this conventional serial-parallel converter has such an advantage that serial-parallel conversion can be performed at two different ratios only by designing a single converter. Please note that the number of conversion ratios corresponds to the number of states provided by the on/off switch.

In this conventional serial-parallel converter, however, plural frequency-divided clocks are generated by the frequency divider. Accordingly, it is necessary to pay attention to skews between these frequency-divided clocks. For example, at a position where data transfer occurs over different frequency-divided clocks, setup and hold time of the first and second flip-flop circuits may become severe. Thus, it is necessary to ensure that the setup time and hold time have a sufficient margin. This makes it more difficult to design the serial-parallel converter.

As for a parallel-serial converter, Japanese Patent Laid-Open Publication No. 8-65173 discloses a parallel-serial converter having an elastic memory and a frequency divider, allowing parallel-serial conversion without the need of using an outside timing signal. More specifically, the frequency divider generates a read clock by dividing a high-speed clock by a fixed number (4), that is, frequency-frequency-division ratio=1/4. Four-bit input parallel data is written into the elastic memory according to an outside timing clock and read from the elastic memory according to the read clock. A parallel-serial conversion timing pulse is generated by using the high-speed clock and the read clock. A parallel-serial converter uses the parallel-serial conversion timing pulse and the high-speed clock to convert the read 4-bit parallel data into high-speed serial data (see paragraphs [0016]–[0019] and FIG. 1).

In this conventional parallel-serial converter, the frequency divider divides the high-speed clock at the predetermined frequency-frequency-division ratio. Thus, this parallel-serial converter also has a problem that the number of bits of low-speed parallel data to be converted into serial data is uniquely determined by the frequency-frequency-division ratio of the frequency divider. As a result, in order to perform parallel-serial conversion at two different ratios, for example, 4:1 and 5:1, two kinds of parallel-serial converters corresponding to those ratios, respectively, have to be designed, thus increasing design workload.

SUMMARY OF THE INVENTION

It is an object of the present invention to provide a data form converter allowing parallel-to-serial or serial-to-parallel conversion at various conversion ratios.

According to an aspect of the present invention, a serial-to-parallel converter for converting serial input data to parallel output data, wherein the serial input data is synchronized with an input clock, includes: a frequency divider for dividing the input clock in frequency at a variable frequency division ratio to produce a single frequency-divided clock; a serial-to-parallel conversion section for converting the serial input data to n-bit parallel data, where n is an integer greater than 1, which is determined depending on the variable frequency division ratio; and a synchronizing section for synchronizing the n-bit parallel data with the single frequency-divided clock to output the parallel output data.

The serial-to-parallel conversion section may be a data shift circuit for shifting the serial input data according to the input clock to store n-bit serial input data and outputting the n-bit serial input data in parallel to the synchronizing section.

The serial-to-parallel converter may further include: a pattern detector for detecting a predetermined pattern of bits from the n-bit serial input data stored in the data shift circuit, wherein the predetermined pattern detector generates a reset signal when the predetermined pattern of bits has been found, wherein the frequency divider is reset to start its frequency dividing operation when the reset signal is generated, causing the synchronizing section to output the parallel output data including the predetermined pattern of bits.

According to another aspect of the present invention, a serial-to-parallel converter includes: a first-stage serial-to-parallel conversion section for converting the serial input data to N-bit parallel data synchronized with a first-stage clock, where N is an integer greater than 1; a frequency divider for dividing the first-stage clock in frequency at a variable frequency division ratio to produce a single frequency-divided clock; N second-stage serial-to-parallel conversion sections each receiving N bit sequences of the N-bit parallel data, wherein each of the N second-stage serial-to-parallel conversion sections converts a corresponding bit sequence to M-bit parallel data, where M is an integer greater than 1, which is determined depending on the variable frequency division ratio, wherein each of the N second-stage serial-to-parallel conversion sections comprises a synchronizing section for synchronizing the M-bit parallel data with the single frequency-divided clock, thereby outputting N×M-bit synchronized parallel data as the parallel output data.

According to still another aspect of the present invention, a parallel-to-serial converter for converting parallel input data to serial output data, wherein the serial output data is synchronized with an output sync clock, includes: a frequency divider for dividing the output sync clock in frequency at a variable frequency division ratio to produce a single frequency-divided clock; a parallel-data storage for storing the parallel input data; a parallel-data reader for reading n-bit parallel data from the parallel-data storage according to the single frequency-divided clock, where n is an integer greater than 1, which is determined depending on the variable frequency division ratio; and a parallel-to-serial conversion section for converting the n-bit parallel input data to the output serial data according to the output sync clock.

According to further aspect of the present invention, a parallel-to-serial converter includes: a frequency divider for dividing a sync clock in frequency at a variable frequency division ratio to produce a single frequency-divided clock, wherein the sync clock is generated from the output sync clock; a plurality of first parallel-to-serial conversion sections, each of which converts a different group of parallel bits of the parallel input data to produce a bit sequence; and a second parallel-to-serial conversion section for converting bit sequences received from the plurality of first parallel-to-serial conversion sections according to the sync clock to output the serial output data according to the output sync clock, wherein each of the first parallel-to-serial conversion sections comprises: a parallel-data storage for storing a corresponding group of parallel bits of the parallel input data; a parallel-data reader for reading n-bit parallel data from the parallel-data storage according to the single frequency-divided clock, where n is an integer greater than 1, which is determined depending on the variable frequency division ratio; and a parallel-to-serial conversion section for converting the n-bit parallel input data to the bit sequence according to the sync clock.

As described above, according to the present invention, a serial-to-parallel or parallel-to-serial conversion section operates according to an input clock and a single frequency-divided clock that is generated from the input clock by a frequency-dividing section with a variable frequency-division ratio. Accordingly, by designing a single serial-to-parallel or parallel-to-serial conversion section, a serial-to-parallel or parallel-to-serial conversion can be performed for different numbers of bits of parallel data. Therefore, it is not necessary to design different serial-to-parallel or parallel-to-serial converters for every number of bits of parallel data, thus largely reducing the design workload.

Moreover, since the serial-to-parallel or parallel-to-serial converter according to the present invention can be structured to operate according to only the input clock and the frequency-divided clock, the circuit structure is made simple and thereby the circuit design is made easier.

In addition, according to an embodiment of the present invention, the frequency dividing section has a reset terminal for inputting a reset signal. Thus, with the addition of a synchronization pattern detection section that generates the reset signal when an input pattern of serial data matches an synchronization pattern, it is possible to output the synchronization pattern included in output parallel data.

Furthermore, according to another embodiment of the invention, the serial-to-parallel or parallel-to-serial converter can be arranged in multiple stages. Thus, even in a case of forming a high-speed data form converter, it is enough that a part of that circuit is design to perform a high-speed operation. This reduces the cost of the entire circuit and also makes it easier to increase the operation speed of the circuit. In addition, such multi-stage circuit allows a plurality of circuit components having the same circuit structure to be used, resulting in reduction of the design workload and design time.

DESCRIPTION OF THE PREFERRED EMBODIMENTS

1. First Embodiment 1.1) Circuit Structure

Figure 1:
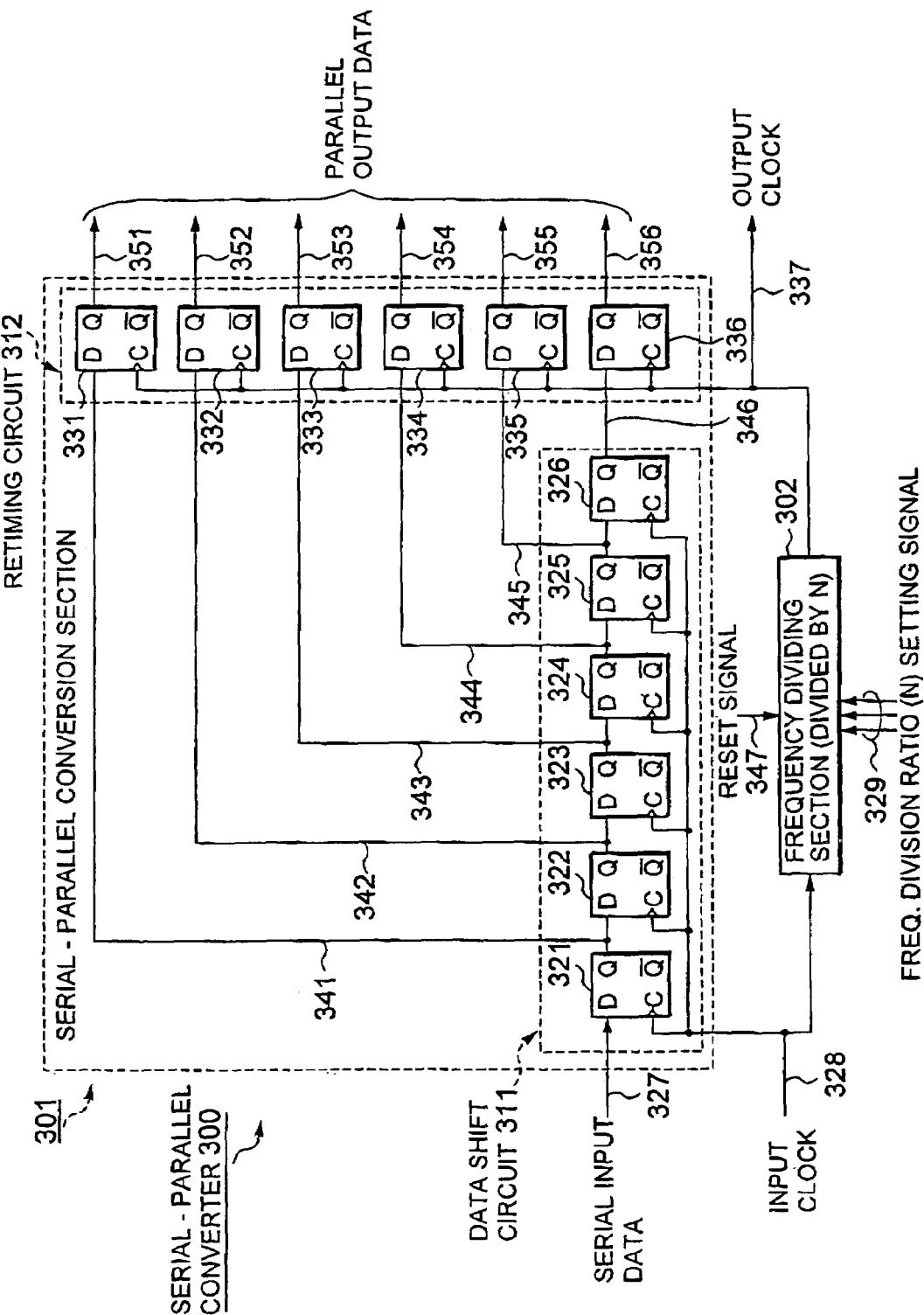
FIG. 1 is a block diagram of a serial-parallel converter according to a first embodiment of the present invention.

Referring to FIG. 1, a serial-parallel converter 300 according to a first embodiment of the present invention includes a serial-parallel conversion section 301 and a frequency dividing section 302. The serial-parallel conversion section 301 is comprised of a data shift circuit 311 and a retiming circuit 312. The data shift circuit 311 includes first to sixth flip-flop circuits 321–326 that are connected in a cascade connection, and sequentially shifts serial input data 327 received at a data input terminal D of the first flip-flop circuit 321 according to an input clock 328. The input clock 328 is also supplied to the frequency dividing section 302. A frequency-division ratio of the frequency dividing section 302 can be set to a selected one (N) of various frequency-division ratios depending on a frequency-division ratio setting signal 329.

The retiming circuit 312 includes first to sixth flip-flop circuits 331–336, each of which has a clock input terminal C supplied with an output clock 337 from the frequency dividing section 302. The first flip-flop circuit 331 of the retiming circuit 312 receives, at its data input terminal D, data 341 from an output terminal Q of the first flip-flop circuit 321 of the data shift circuit 311. The data 341 is also transferred to a data input terminal D of the second flip-flop circuit 322 at the next stage. Similarly, the second flip-flop circuit 332 of the retiming circuit 312 receives, at its data input terminal D, data 342 from an output terminal Q of the second flip-flop circuit 322 of the data shift circuit 311. The data 342 is also transferred to a data input terminal D of the third flip-flop circuit 323 at the next stage. The third to fifth flip-flop circuits 333 through 335 of the retiming circuit 312 each receive data 343–345 in a similar manner. The sixth flip-flop circuit 336 of the retiming circuit 312 receives, at its data input terminal D, data 346 output from an output terminal Q of the sixth flip-flop circuit 326 of the data shift circuit 311.

In the serial-parallel converter 300, the serial input data 327 and the input clock 328 synchronized with the input data 327 are received from outside. The serial input data 327 is sequentially shifted through the first to sixth flip-flop circuits 321–326 in the data shift circuit 311 according to the input clock 328. The input clock 328 is also supplied to the frequency dividing section 302. The frequency dividing section 302 is reset by a reset signal 347, divides the input clock 328 at a frequency-division ratio (N) determined depending on the frequency-division ratio setting signal 329, and outputs the output clock 337 to outside and also supplied to each of the first to sixth flip-flop circuits 331–336 of the retiming circuit 312.

Each of the first to sixth flip-flop circuits 331–336 changes the timing of a corresponding one of the data 341–346 received from the flip-flop circuits 321–326 of the data shift circuits 311 on the rising edge of the output clock 337. Then, the first to sixth flip-flop circuits 331–336 output the corresponding data changed in timing from their output terminals Q as output data 351–356, respectively.

1.2) First Example of Frequency Dividing Section

Figure 2:
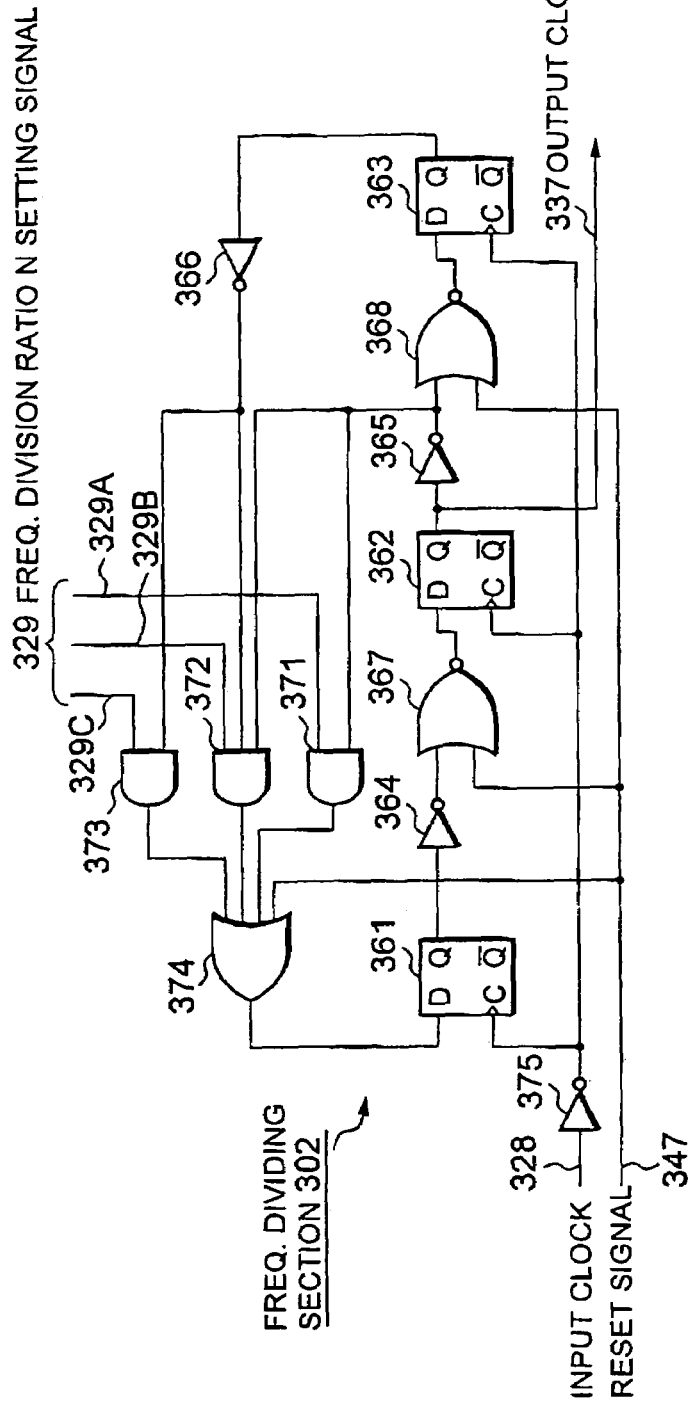
FIG. 2 is a circuit diagram showing an example of a frequency dividing section as shown in FIG. 1.

As shown in FIG. 2, the frequency dividing section 302 includes first to third flip-flop circuits 361–363 each having output terminals Q connected to first to third inverters 364–366. The output terminal of the first inverter 364 is connected to one input of a NOR circuit 367. The other input of the NOR circuit 367 receives the reset signal and its output is connected to the data input of the second flip-flop circuit 362. Similarly, the output terminal of the second inverter 365 is connected to one input of NOR circuit 368. The other input of the NOR circuit 368 receives the reset signal and its output is connected to the data input of the second flip-flop circuit 362. The output terminal Q of the third flip-flop circuit 363 is connected to the inverter 366.

Further, the frequency dividing section 302 includes first to third AND circuits 371–373 and an OR circuit 374. The AND circuit 371 inputs the output of the inverter 365 and a first setting bit 329A of the frequency division ratio setting signal 329. The AND circuit 372 inputs the output of the inverter 365, the output of the inverter 366, and a second setting bit 329B of the frequency division ratio setting signal 329. The AND circuit 373 inputs the output of the inverter 366 and a third setting bit 329C of the frequency division ratio setting signal 329. The OR circuit 374 inputs the reset signal 347 and the outputs of the first to third AND circuits 371–373 and outputs the logical sum of the inputs to the data input D of the flip-flop circuit 361.

The input clock 328 is supplied to clock inputs of the first to third flip-flop circuits 361–363 through a fourth inverter 375 that inverts a logic of the input clock 328. Accordingly, the frequency dividing section 302 divides the input clock 328 in synchronization with falling edges of the input clock 328, and has a frequency-division ratio that can be changed in three ways in accordance with the setting bits 329A, 329B and 329C of the frequency-division ratio setting signal 329. In this manner, the input clock 328 is divided in frequency by N to produce the output clock 337 at the output terminal Q of the second flip-flop circuit 362.

As shown in FIG. 28, when the setting bits 329A, 329B and 329C of the frequency-division ratio setting signal 329 are set "1," "0," and "0," respectively, the output of the inverter 365 is output to the flip-flop circuit 361 through the AND circuit 371 and the OR circuit 374, so that the frequency dividing section 302 serves as a 1/4 divider. When the setting bits 329A, 329B and 329C of the frequency-division ratio setting signal 329 are set "0," "1," and "0," respectively, the frequency dividing section 302 serves as a 1/5 divider. When the setting bits 329A, 329B and 329C of the frequency-division ratio setting signal 329 are set "0," "0," and "1," respectively, the frequency dividing section 302 serves as a 1/6 divider.

1.3) Second Example of Frequency Dividing Section

In FIG. 3A, the same components as those in FIG. 2A are labeled with the same reference numerals as those in FIG. 2A, and the description thereof is omitted.

As shown in FIG. 3A, the frequency dividing section 302A includes first and second AND circuits 371A and 372A and an OR circuit 374A. The AND circuit 371A inputs the output of the inverter 365 and the frequency division ratio setting signal 329A having one bit. The AND circuit 372A inputs the output of the inverter 365 and the output of the inverter 366. The OR circuit 374A inputs the reset signal and the outputs of the AND circuits 371A and 371B.

Similarly to the first example as shown in FIG. 2A, the input clock 328 is supplied to clock inputs of the first to third flip-flop circuits 361–363 through the fourth inverter 375. Accordingly, the frequency dividing section 302A divides the input clock 328 in synchronization with falling edges of the input clock 328, and has a frequency-division ratio that can be changed in two ways in accordance with the 1-bit frequency-division ratio setting signal 329A. In this manner, the input clock 328 is divided by N to produce the output clock 337 from the output terminal Q of the second flip-flop circuit 362.

As shown in FIG. 3B, in this frequency dividing section 302A, the frequency-division ratio can be changed in two ways in accordance with the frequency-division ratio setting signal 329A. In other words, when the frequency-division ratio setting signal 329A has a value of "1," the frequency dividing section 302A serves as a 1/4 divider. When the frequency-division ratio setting signal 329A has a value of "0," the frequency dividing section 302A serves as a 1/5 divider.

1.4) Serial to Parallel Conversion

Figure 3:
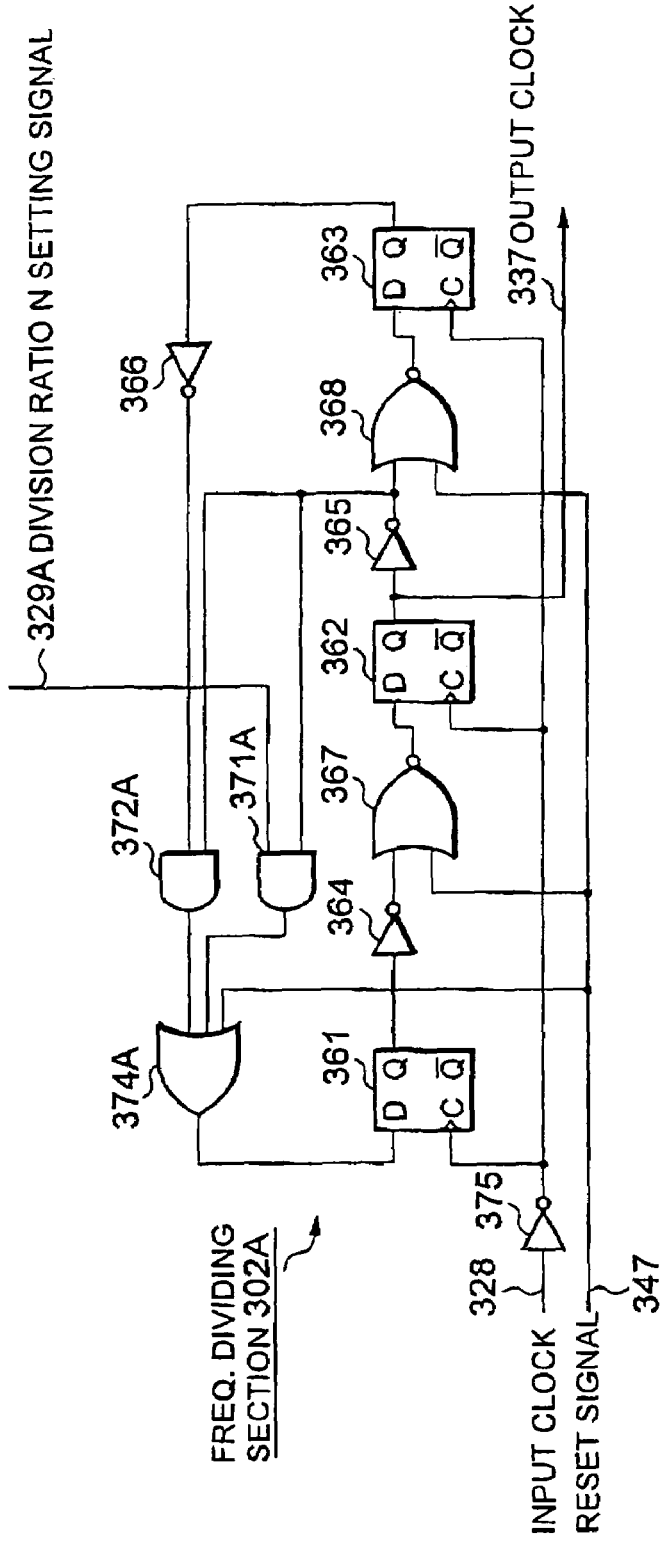
FIG. 3 is a circuit diagram of another example of the frequency dividing section as shown in FIG. 1.
Figure 4:
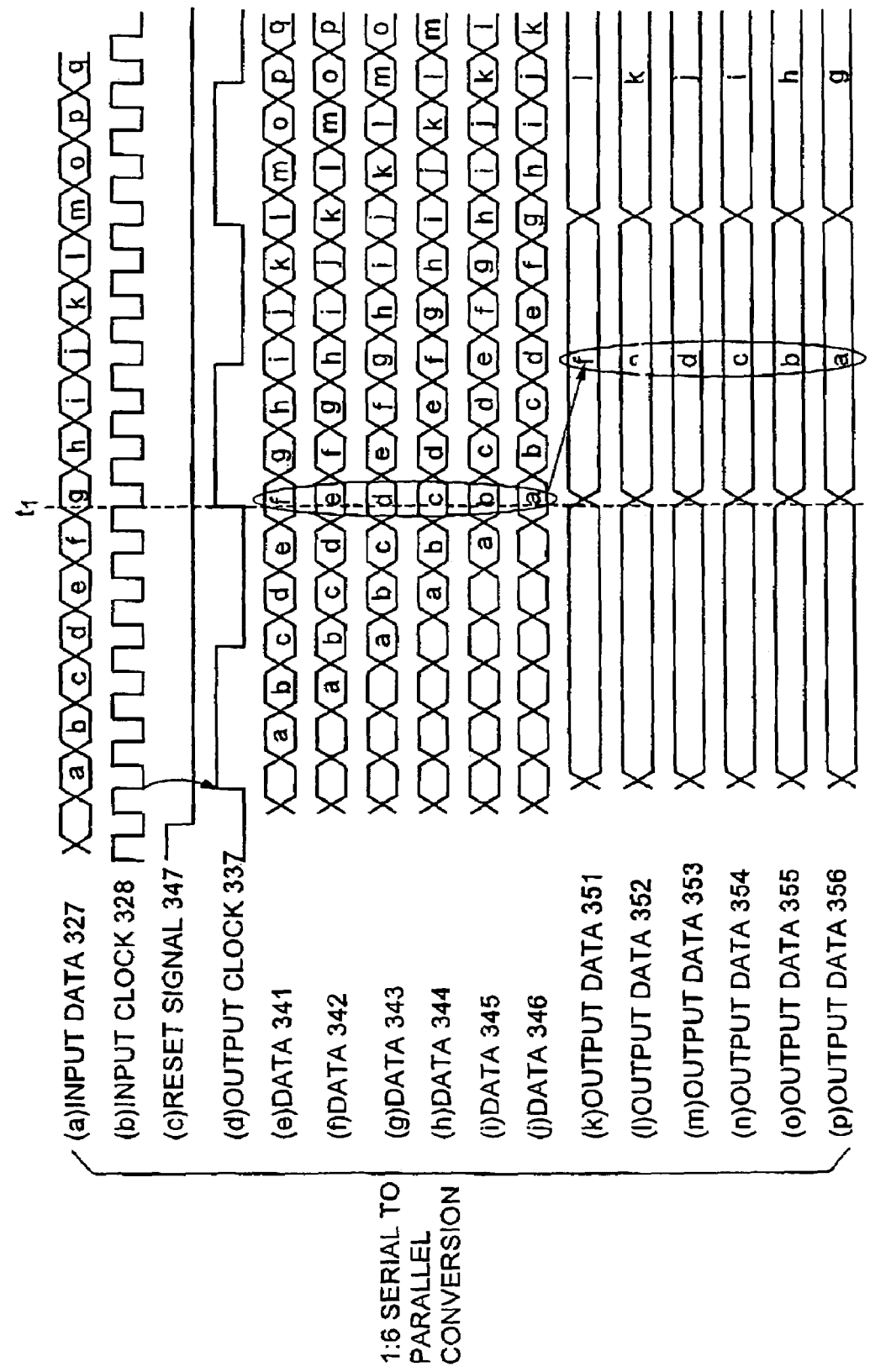
FIG. 4 is a timing chart showing 1:6 serial-parallel conversion of the serial-parallel converter according to the first embodiment.
Figure 5:
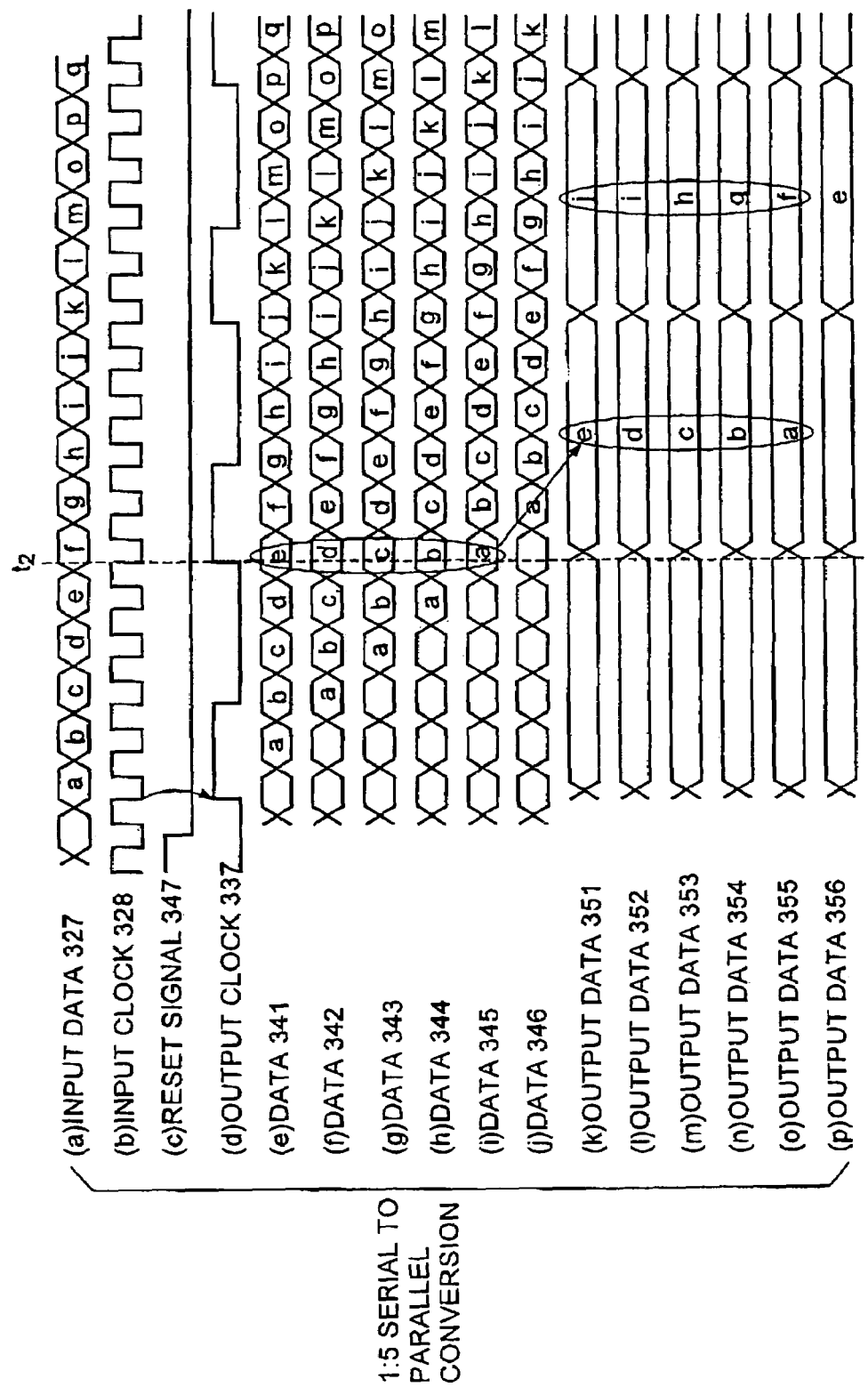
FIG. 5 is a timing chart showing 1:5 serial-parallel conversion of the serial-parallel converter according to the first embodiment.
Figure 6:
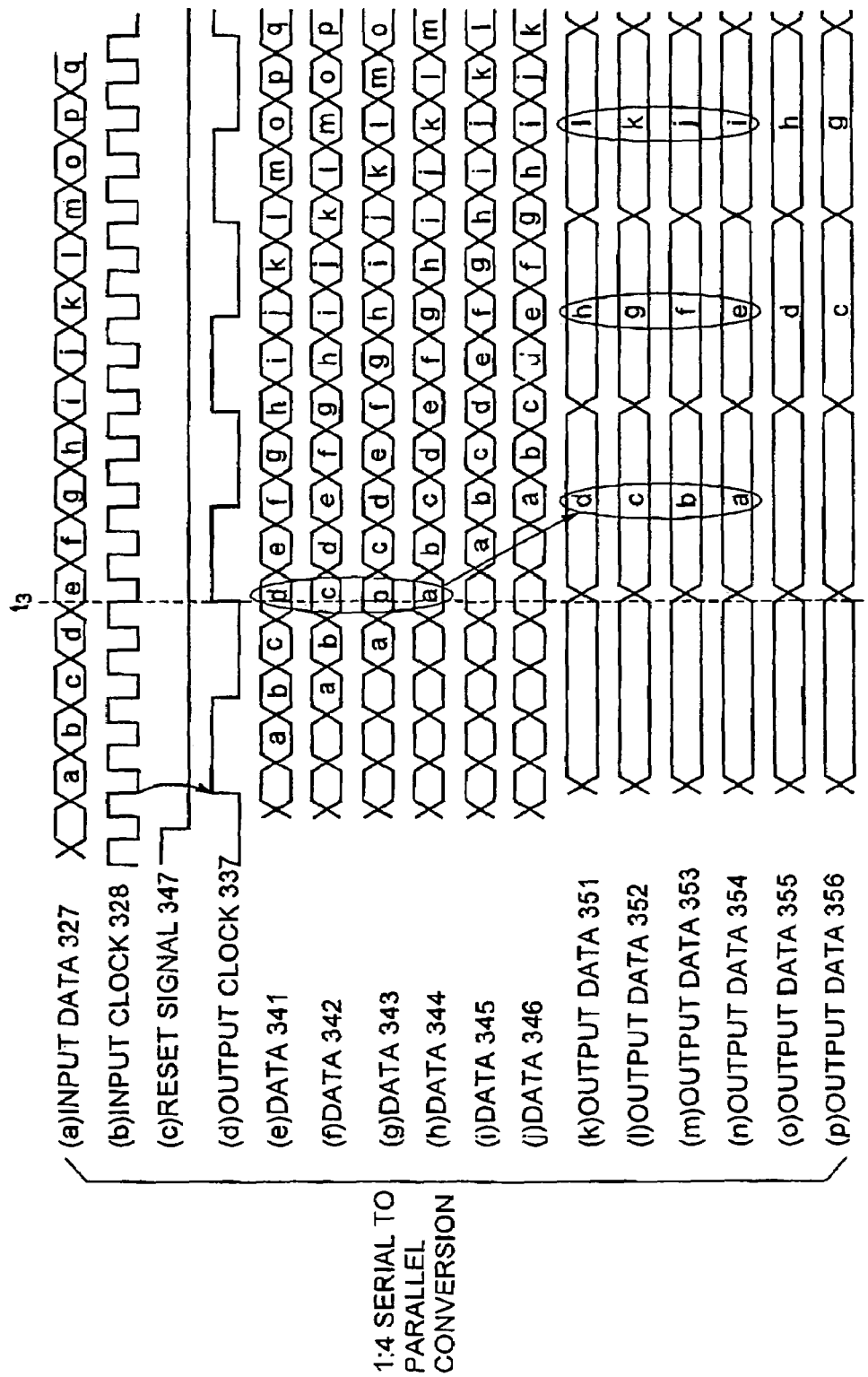
FIG. 6 is a timing chart showing 1:4 serial-parallel conversion of the serial-parallel converter according to the first embodiment.

FIG. 4 shows 1:6 serial-parallel conversion, which is performed by setting the frequency-division ratio to 6. FIG. 5 shows 1:5 serial-parallel conversion, which is performed by setting the frequency-division ratio to 5. FIG. 6 shows 1:4 serial-parallel conversion, which is performed by setting the frequency-division ratio to 4. The 1:5 and 1:4 serial-parallel conversion cases as shown in FIGS. 5 and 6 can be achieved by employing the frequency dividing section 302 shown in FIG. 2 or the frequency dividing section 302A shown in FIG. 3.

For the sake of simplicity, hereinafter the description is made referring to an example using the frequency dividing section 302 shown in FIG. 2. The description related to the frequency dividing section 302A shown in FIG. 3 will be omitted because the basic operation of the frequency dividing section 302A is the same as that of the frequency dividing section 302.

When a reset signal 347 as shown in FIGS. 4(c), 5(c) and 6(c) is changed from "1" to "0" at a predetermined time, the frequency dividing section 302 starts frequency division of the input clock 328 as shown in FIGS. 4(b), 5(b) and 6(b). When the division of the input clock 328 started, an output clock 337 rises at the first falling edge of the input clock 328 as shown in FIGS. 4(d), 5(d), and 6(d). Then a clock having a period corresponding to six periods of the input clock 328 is output as the output clock 337 in the case of FIG. 4, a clock having a period corresponding to five periods of the input clock 328 is output as the output clock 337 in the case of FIG. 5, and a clock having a period corresponding to four periods of the input clock 328 is output as the output clock 337 in the case of FIG. 6.

A detailed operation of the serial-parallel converter 300 using the frequency dividing section 302 will be described with reference to FIGS. 4 through 6.

Input data 327 shown in FIGS. 4(a), 5(a), and 6(a) is shifted in the data shift circuit 311 (see FIG. 1) in accordance with the input clock 328. Consequently, the respective data 341–346 appearing at the output terminals Q of the first to sixth flip-flop circuits 321–326 are shifted by one clock on each rising edge of the input clock 328 as shown in FIGS. 4(e)–(j), 5(e)–(j), and 6(e)–(j)). Here, a sequence of the input data 327 are denoted by a, b, c, . . . . The data 341–346 are input to the retiming circuit 312 that changes timings of the data 341–346 with rising edges of the output clock 337. Accordingly, output data 351–356 of the retiming circuit 312 are produced as parallel data according to the output clock 337 as shown in FIGS. 4(k)–(p), 5(k)–(p), and 6(k)–(p).

The parallel output data 351–356 are obtained by 1:6 serial-parallel conversion of the input data 327 in the case of FIG. 4, by 1:5 serial-parallel conversion of the input data 327 in the case of FIG. 5, and by 1:4 serial-parallel conversion of the input data 327 in the case of FIG. 6.

The case of FIG. 4 where 1/6 division is performed will be described more specifically. As an example, a time t1 shown with broken line in FIG. 4 is considered. It is assumed that the input data 327 shown in FIG. 4(a) is a sequence of data units labeled "a," "b," . . . "f" in that order. These data units are sequentially shifted by the first to sixth flip-flop circuits 321–326. Thus, at the time t1, the first flip-flop circuit 321 outputs the data unit "f," and the second flip-flop circuit 322 outputs the data unit "e." Similarly, the third to sixth flip-flop circuits 323–326 output the data units "d," "c," "b," and "a," respectively. These data units "f," "e," . . . "a" are latched by the first to sixth flip-flop circuits 331–336 on the rising edge of the output clock 337 that is a divided-by-6 clock. As a result, during one period of the output clock 337 until the subsequent rising edge of the output clock 337, the respective output terminals Q of the first to sixth flip-flop circuits 331–336 output the data units "f," "e," . . . "a" as the output data 351–356 in parallel.

In the case of FIG. 5 where 1/5 division is performed, a time t2 shown with broken line in FIG. 5 is considered. It is assumed that the input data 327 shown in FIG. 5(a) is a sequence of data units "a," "b," . . . "e" in that order. These data units are sequentially shifted by the first to fifth flip-flop circuits 321–325. Consequently, at the time t2, the first flip-flop circuit 321 outputs the data unit "e," and the second flip-flop circuit 322 outputs the data unit "d." Similarly, the third to fifth flip-flop circuits 323–325 output the data units "c," "b" and "a", respectively. These data units "e," "d," . . . "a" are latched on the rising edge of the output clock 337 as a divided-by-5 clock by the first to fifth flip-flop circuits 331–335. As a result, during one period of the output clock 337 until the subsequent rising edge of output clock 337, the respective data units "e," "d," . . . "a" are output from the output terminals Q of the first to fifth flip-flop circuits 331–335 as the output data 351–355.

In the case of FIG. 6 where 1/4 division is performed, a time t3 shown with broken line in FIG. 6 is considered. It is assumed that the input data 327 shown in FIG. 6(a) is a sequence of data units "a," "b," "c," and "d" in that order. These data units are sequentially shifted by the first to fourth flip-flop circuits 321–324. Consequently, at the time t3, the first flip-flop circuit 321 outputs the data unit "d," and the second flip-flop circuit 322 outputs the data unit "c".Similarly, the third and fourth flip-flop circuits 323 and 324 output data units "b" and "a," respectively. These data units "d," "c," "b," and "a" are latched on the rising edge of the output clock 337 as a divided-by-4 clock by the first to fourth flip-flop circuits 331–334, respectively. As a result, during one period of the output clock 337 until the subsequent rising edge of the next output clock 337, the data units "d," "c," "b," and "a" are output as the output data 351–354 from the output terminals Q of the first to fourth flip-flop circuits 331–334 in parallel.

As described above, the frequency dividing section 302 of this embodiment has a frequency-division ratio that can be changed in accordance with the frequency-division ratio setting signal 329 that is set from outside. Thus, only by designing a single serial-parallel converter, it is operable in various cases where the number of bits of parallel data is different. Therefore, it is unnecessary to design different serial-parallel converters for the different number of bits of parallel data, thus reducing the design workload largely.

Moreover, in this embodiment, the serial-parallel converter 300 can be designed easily because it has a simple structure that can operate with the input clock 327 and a single frequency-divided clock 337 only.

1.5) Modified Embodiment

Figure 7:
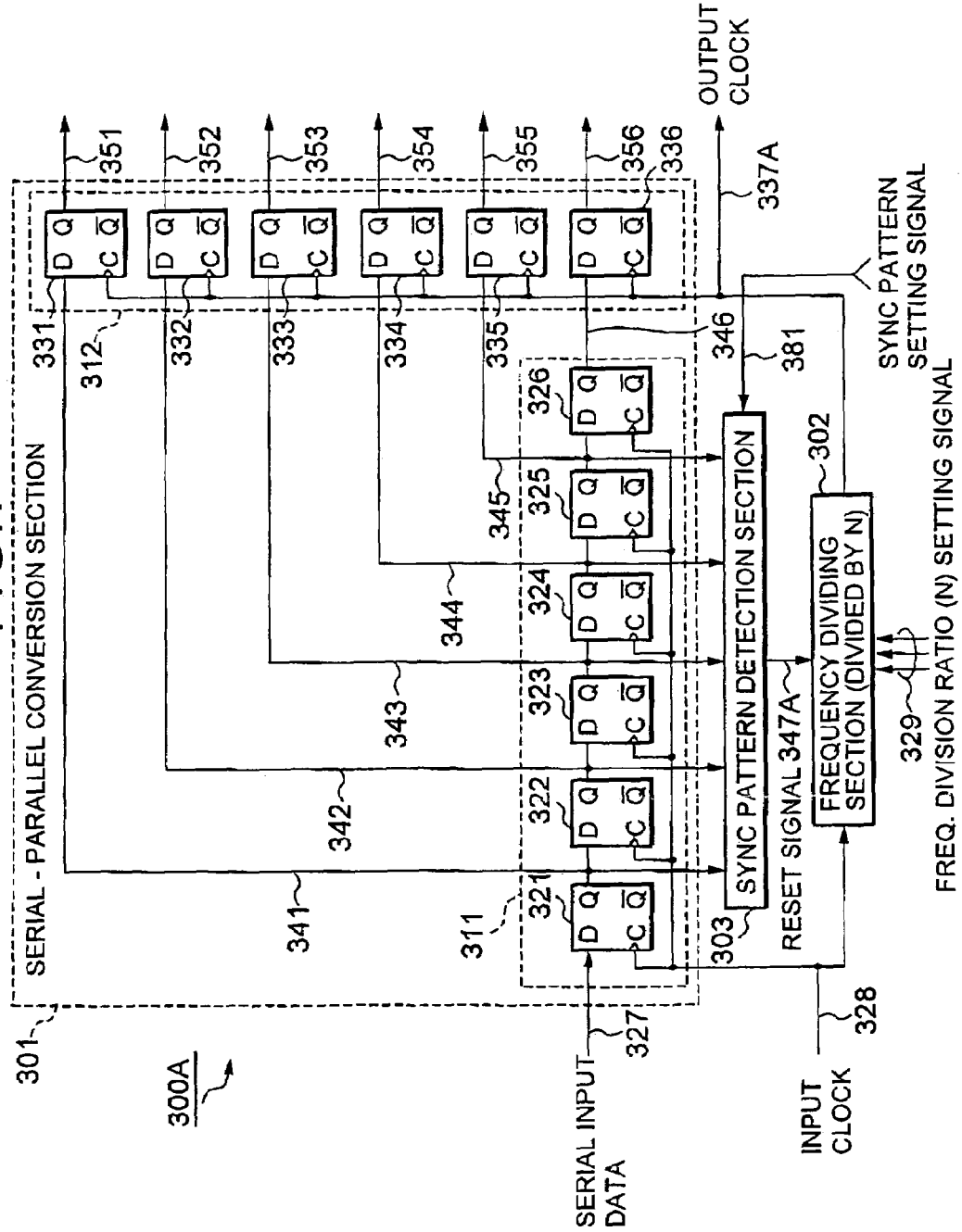
FIG. 7 is a block diagram showing a serial-parallel converter according to a modification of the first embodiment of the present invention.

In FIG. 7, the same components as those in FIG. 1 are labeled with the same reference numerals as those in FIG. 1, and the description thereof is omitted. A serial-parallel converter 300A according to this modification includes the serial-parallel conversion section 301 and the frequency dividing section 302 that are shown in FIG. 1. The serial-parallel converter 300A further has a synchronization pattern detection section 303 provided between the serial-parallel conversion section 301 and the frequency dividing section 302.

The synchronization pattern detection section 303 inputs the data 341–346, which are output from the output terminals Q of the first to sixth flip-flop circuits 321–326 included in the data shift circuit 311, respectively, and a synchronization pattern setting signal 381 input from outside. The synchronization pattern detection section 303 outputs a reset signal 347A to the frequency dividing section 302 when a bit pattern of the data 341–346 matches a predetermined pattern of bits that is set by the synchronization pattern setting signal 381. As a result, the frequency dividing section 302 is reset to start the frequency dividing operation to output an output clock 337A to the retiming circuit 312.

Figure 8:
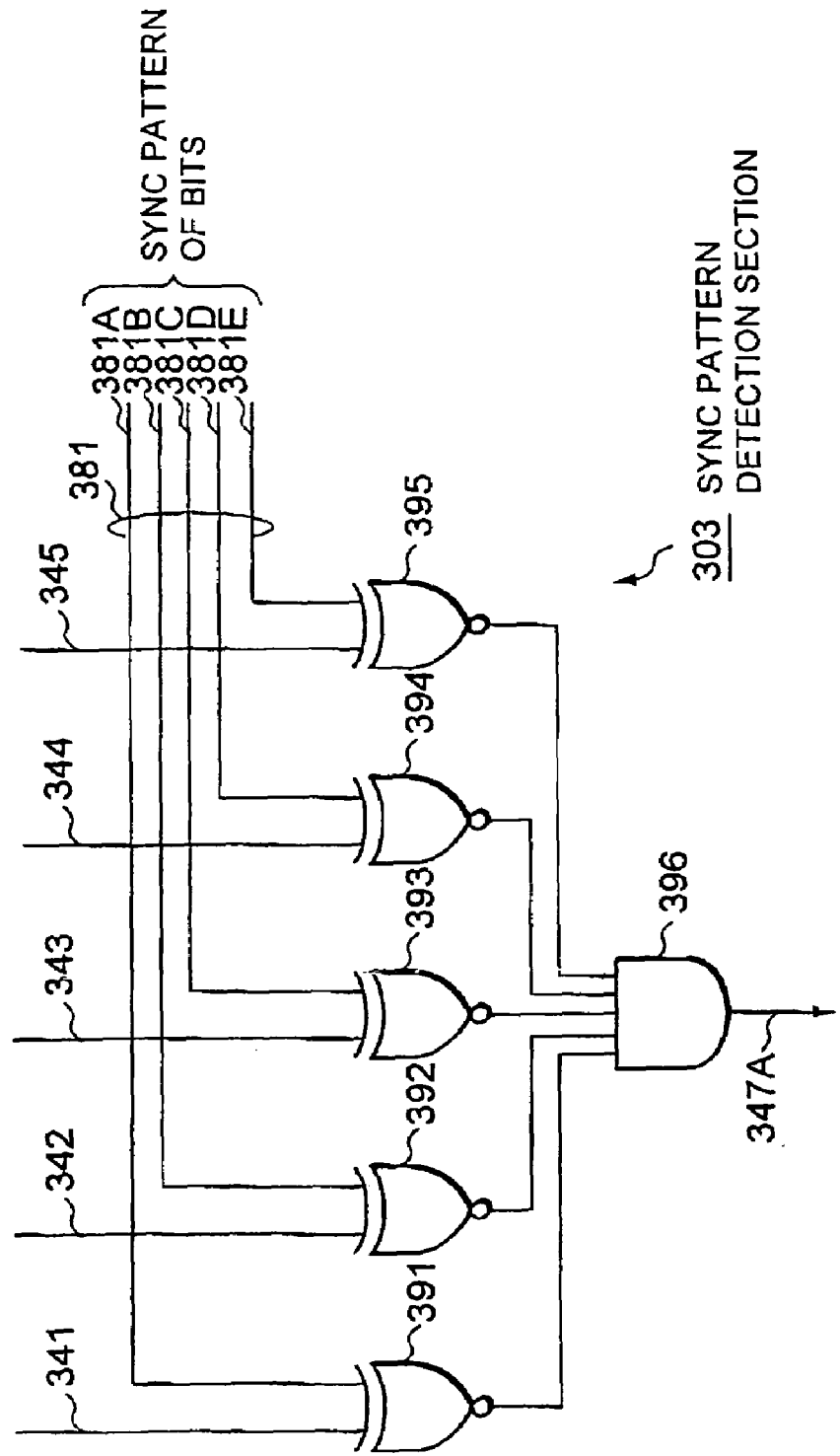
FIG. 8 is a circuit diagram showing the structure of a synchronization pattern detection section as shown in FIG. 7.

As shown in FIG. 8, the synchronization pattern setting signal 381 is parallel data composed of bits 381A–381E forming a sync pattern to be set. The synchronization pattern detection section 303 includes first to fifth exclusive NOR (EX-NOR) circuits 391–395 and a five-input AND circuit 396 connected to the outputs of the EX-NOR circuits. The first EX-NOR circuit 391 inputs the data 341 and the first bit 381A of the synchronization pattern setting signal 381. The second EX-NOR circuit 392 inputs the data 342 and the second bit 381B of the synchronization pattern setting signal 381. Similarly, the third, fourth, and fifth EX-NOR circuits 393, 394, and 395 input the data 343, 344, and 345 and the third, fourth, and fifth bits 381C, 381D, and 381E of the synchronization pattern setting signal 381, respectively. An output of the five-input AND circuit 396 serves as the reset signal 347A.

Figure 9:
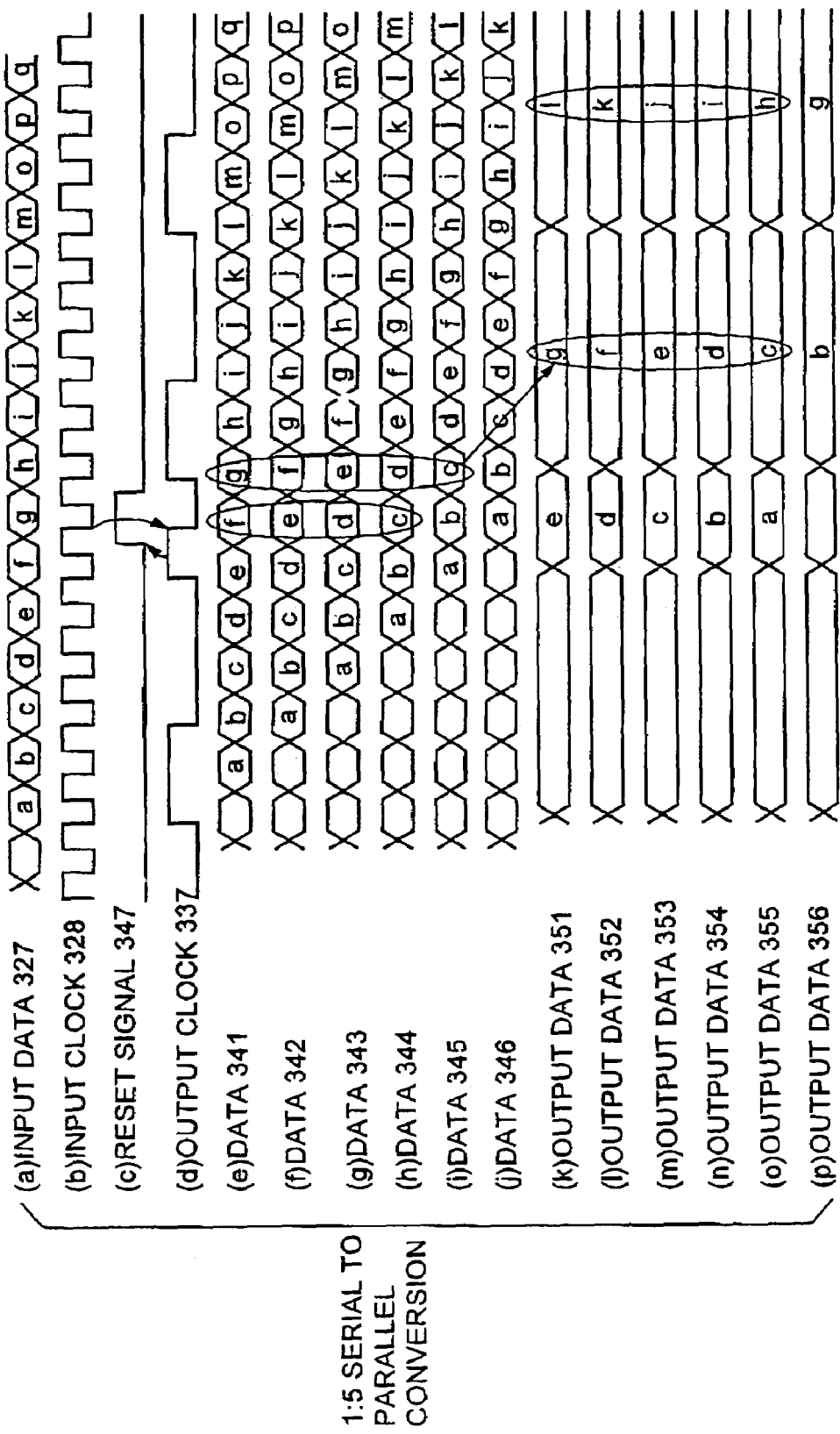
FIG. 9 is a timing chart showing 1:5 serial-parallel conversion of the serial-parallel converter according to the modification of the first embodiment.

In FIG. 9 showing 1:5 serial-parallel conversion, operations and data similar to those previously described in FIG. 5 are denoted by the same reference numerals and symbols and the description thereof is omitted.

As shown in FIG. 9, the level of the reset signal 347A becomes "1" when a pattern of the data 341–344 (data units "f" through "c") shown in FIG. 9(e)–(h) matches a pattern of bits 381A–381D of the synchronization pattern setting signal. Please note that each of data units "a," "b,". . . is a binary signal that takes a value of "1" or "0."

In the synchronization pattern detection section 303, a 4-bit synchronization pattern formed by arbitrarily combining "1" and "0" can be set by the bits 381A–381D of the synchronization pattern setting signal 381. At the time when the synchronization pattern detection section 303 inputs 4-bit data "f," "e," "d," and "c," matching the above-described 4-bit synchronization pattern as the data 341–344 from the data shift circuit 311 as shown in FIG. 9(e)–(h), the synchronization pattern detection section 303 changes the level of the reset signal 347A to "1," as shown in FIG. 9(c). At the time when the reset signal 347A becomes "1," the frequency dividing section 302 is reset. Thus, the output clock 337A becomes "0" on the falling edge of the input clock 328 as shown in FIGS. 9(b) and (d) and then becomes "1" on the next falling edge of the input clock 328. As a result of changing the timings of the data 341–346 (FIG. 9(e) through 9(j)) by the retiming circuit 312 with the rising edge of the output clock 337A, the data units "f" through "c" corresponding to the synchronization pattern are arranged and output as the output data 352–355. At this time, the data unit "g" is output as the remaining output data 351. These output data 351–355 are a result of 1:5 serial-parallel conversion of the input data 327.

As described above, in this modification, the synchronization pattern detection circuit 303 generates the reset signal 347A when a preset sync pattern is detected in the data shift circuit 311 and the reset signal 347a causes the frequency dividing section 302 to be reset: Accordingly, it is possible to arrange and output parallel data 351–356 including the synchronization pattern.

2. Second Embodiment 2.1) Circuit Structure

Figure 10:
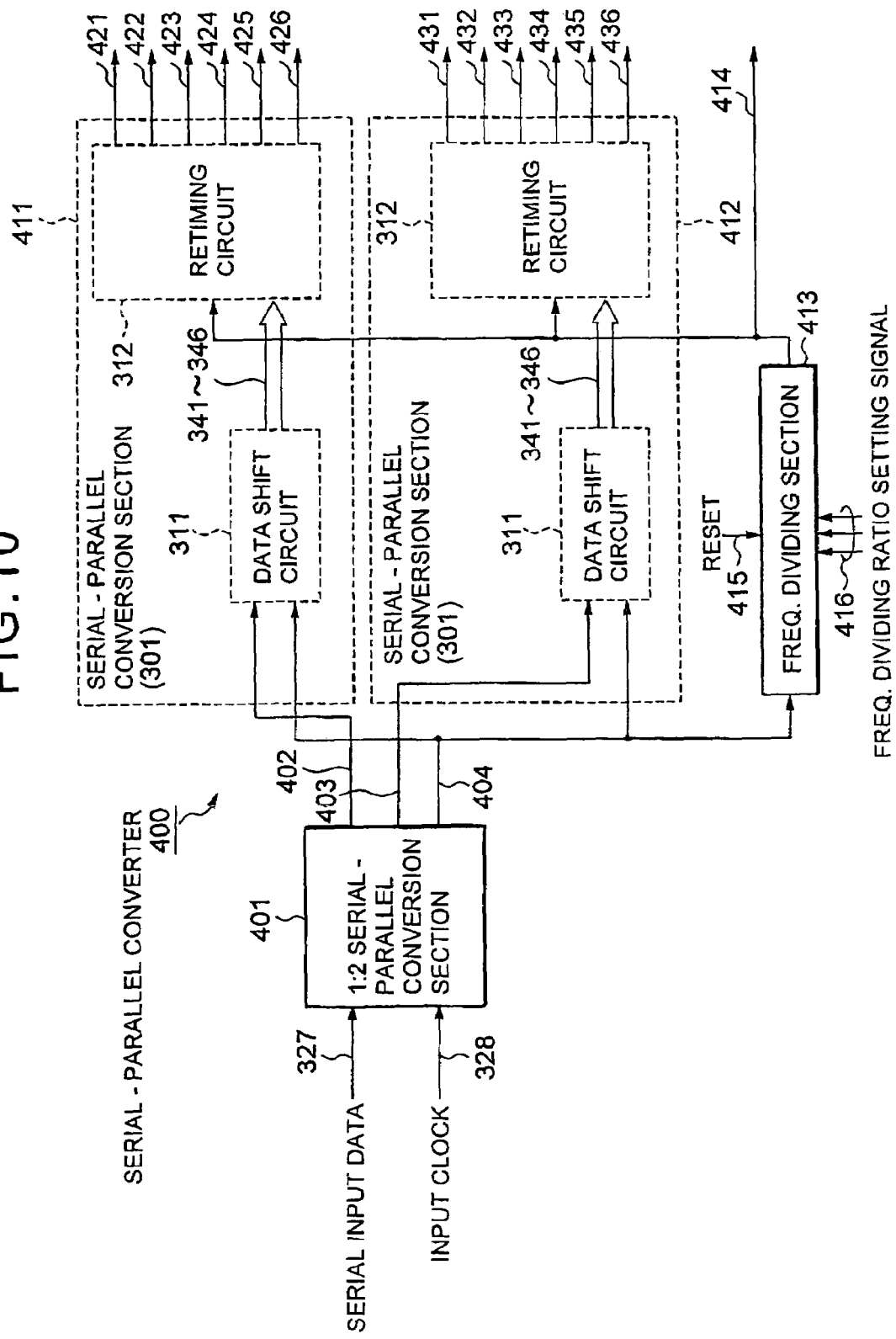
FIG. 10 is a schematic diagram showing a multistage serial-parallel converter according to a second embodiment of the present invention.

Referring to FIG. 10, a serial-parallel converter 400 according to a second embodiment of the present invention includes a 1:2 serial-parallel conversion section 401, a first serial-parallel conversion section 411, a second serial-parallel conversion section 412, and a frequency dividing section 413. Each of the serial-parallel conversion sections 411 and 412 has the same circuit structure as that of the serial-parallel conversion section 301 as shown in FIG. 1. Accordingly, the data shift circuit 311 and the retiming circuit 312 are depicted by dashed lines in each of the serial-parallel conversion sections 411 and 412. The frequency dividing section 413 also has the same circuit structure as that of the frequency dividing section 302 as shown in FIG. 1.

In such a circuit as shown in FIG. 10, the input data 327 and the input clock 328 are first input to the 1:2 serial-parallel conversion section 401. The 1:2 serial-parallel conversion section 401 performs serial-parallel conversion of the input data 327 to produce 2-bit parallel data and a first-stage output clock 404, where the 2-bit parallel data is composed of first serial output data 402 and second serial output data 403.

The first serial output data 402 is supplied to the first serial-parallel conversion section 411, while the second serial output data 403 is supplied to the second serial-parallel conversion section 412. The first-stage output clock 404 is supplied to both the first and second serial-parallel conversion sections 411 and 412 as the input clock 328 and is also supplied to the frequency dividing section 413.

The frequency dividing section 413 divides the first-stage output clock 404 to produce a divided-by-N clock, which is output as an output clock 414 to the retiming circuit 312 in each of the first and second serial-parallel conversion sections 411 and 412.

The data shift circuit 311 in the first serial-parallel conversion section 411 shifts the first serial output data 402 according to the first-stage output clock 404 and outputs data 341-346 from the first to sixth flip-flop circuits 321-326 as shown in FIG. 1 to the retiming circuit 312. The retiming circuit 312 changes timings of the data 341-346 on the rising edge of the output clock 414 input from the frequency dividing section 413. Then, output data 421-426 (corresponding to the output data 351-356 in FIG. 1) appear on the output terminals Q of the first to sixth flip-flop circuits 331-336 in the retiming circuit 312.

Similarly, the data shift circuit 311 in the second serial-parallel conversion section 412 shifts the second serial output data 403 according to the first-stage output clock 404 and outputs data 341-346 from the first to sixth flip-flop circuits 321-326 to the retiming circuit 312. The retiming circuit 312 changes timings of the data 341-346 on the rising edge of the output clock 414 input from the frequency dividing section 413. Then, output data 431-436 appear on the output terminals Q of the first to sixth flip-flop circuits 331-336 in the retiming circuit 312.

The frequency dividing section 413 starts division of the first-stage output clock 404 when a level of a reset signal 415, which corresponds to the reset signal 347 as shown in FIG. 1, has been changed from "1" to "0" (see FIGS. 4(c), 5(c), and 6(c)). This corresponds to the start of division of the input clock 328 as shown in FIGS. 4(b), 5(b), and 6(b)) in the first embodiment. The frequency dividing section 413 can set its frequency-division ratio in various ways by a frequency-division ratio setting signal 416. This setting of the frequency-division ratio corresponds to the setting of the frequency-division ratio by the frequency-division ratio setting signal 329 in the first embodiment as shown in FIG. 1.

2.2) Examples of 1:2 Serial-parallel Conversion Section

Figure 11:
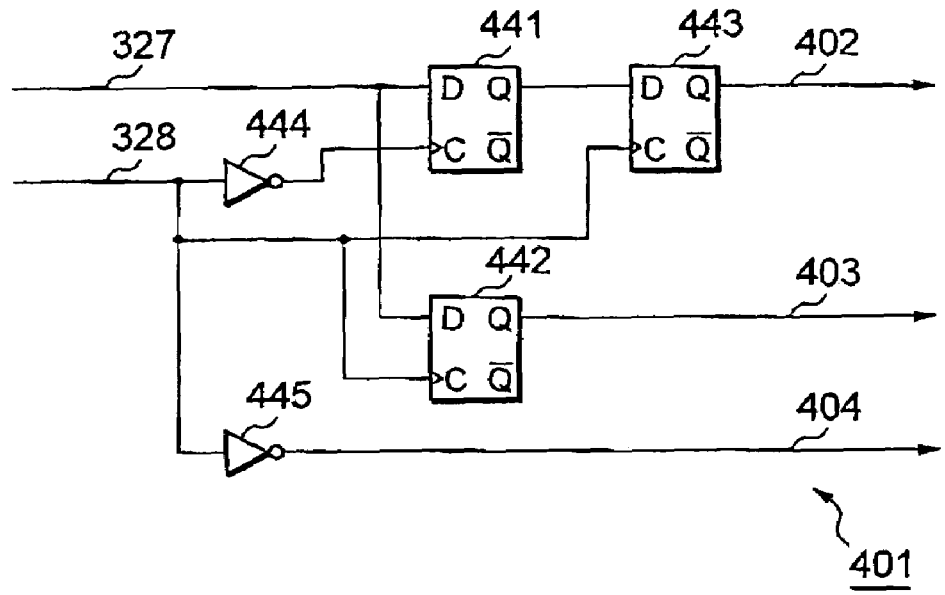
FIG. 11 is a circuit diagram showing an example of a 1:2 serial-parallel conversion section in the second embodiment.

Referring to FIG. 11, a 1:2 serial-parallel conversion section 401, as a first example, includes first and second is flip-flop circuits 441 and 442 that receive the input data 327 at their data input terminals Q, a third flip-flop circuit 443 having a data input terminal D connected to an output terminal Q of the first flip-flop circuit 441, an inverter 444 that inverts a logic of the input clock 328, and a delay circuit 445 that provides a predetermined time delay on the input clock 328.

An output of the inverter 444 is supplied to a clock input terminal C of the first flip-flop circuit 441, and the input clock 328 is supplied to clock input terminals C of the second and third flip-flop circuits 442 and 443. In the 1:2 serial-parallel conversion section 401, the first serial output data 402 is output from the output terminal Q of the third flip-flop circuit 443, and the second serial output data 403 is output from the output terminal Q of the second flip-flop circuit 442. Moreover, an output of the delay circuit 445 serves as the first-stage output clock 404. Since the input clock 328 is used as the first-stage output clock 404, the predetermined time delay of the input clock 328 is needed to meet the output timing of the first and second serial output data 402 and 403 generated through the first and second flip-flop circuits 441 and 442 and the third flip-flop circuit 443.

In the 1:2 serial-parallel conversion section 401 shown in FIG. 11, retiming of the input data 327 is made on both the rising and falling edges of the input clock 328. The frequency of the input clock 328 is half that of the input data 327.

Figure 12:
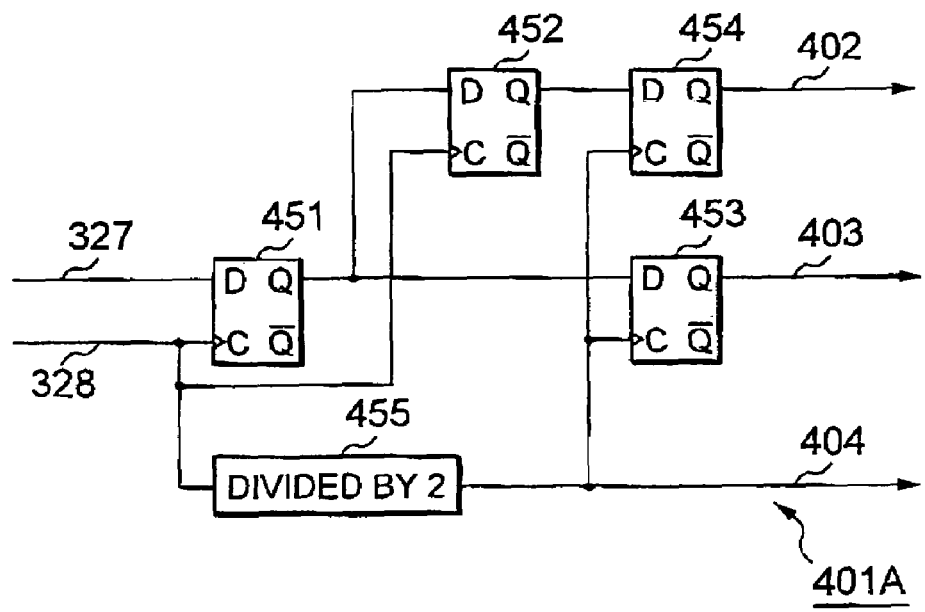
FIG. 12 is a circuit diagram showing another example of S the 1:2 serial-parallel conversion section in the second embodiment.

Referring to FIG. 12, a 1:2 serial-parallel conversion section 401A, as a second example, includes a first flip-flop circuit 451 that receives the input data 327 at its data input terminal D, second and third flip-flop circuits 452 and 453 connected at their data input terminals D to an output terminal Q of the first flip-flop circuit 451, a fourth flip-flop circuit 454 connected at its data input terminal D to an output terminal Q of the second flip-flop circuit 452, and a 1/2 divider 455 that divides the input clock 328 by two to produce the first-stage output clock 404. The input clock 328 is also supplied to clock input terminals C of the first and second flip-flop circuits 451 and 452. The first-stage output clock 404 obtained by the 1/2 divider 455 is supplied to the clock input terminals C of the third and fourth flip-flop circuits 453 and 454. The first-stage output clock 404 is also supplied to the first and second serial-parallel conversion sections 411 and 412 shown in FIG. 10.

The 1:2 serial-parallel conversion section 401A shown in rig. 12 also has a simple circuit structure like the 1:2 serial-parallel conversion section 401 shown in FIG. 11. In the 1:2 serial-parallel conversion section 401A, the timings of the input data 327 are changed with the rising edges of the input clock 328. Accordingly, the frequency of the input clock 328 is equal to that of the input data 327.

As described above, the serial-parallel converter 400 shown in FIG. 10, which uses the 1:2 serial-parallel conversion section 401 or 401A shown in FIG. 11 or 12, performs serial-parallel conversion of each of the first and second serial output data 402 and 403, whose rate is a half that of the input data 327.

Accordingly, only the 1:2 serial-parallel conversion section 401 or 401A having the above simple structure performs processing of the high-speed input data 327. On the other hand, the first and second serial output data 402 and 403 each supplied to the first and second serial-parallel conversion sections 411 and 412 in the next stage have a rate that is a half that of the input data 327. Therefore, an advantageous effect is obtained that the serial-parallel converter 400 as a whole can be easily applied to a high-speed operation.

According to the second embodiment as shown in FIG. 10, the input data 327 is first input to the 1:2 serial-parallel conversion section 401 or 401A. However, the input data 327 may be input to a serial-parallel conversion section having a conversion ratio 1:n other than 1:2, where n is an integer greater than 2. In this case, the 1:n serial-parallel conversion section may have a structure in which timings of the data input thereto are retimed using a multiphase clock. Moreover, the 1:n serial-parallel converter may perform serial-parallel conversion at a conversion ratio selected from a plurality of conversion ratios depending on selection control input from outside.

In the second embodiment, the serial-parallel converter 400 has two-stage structure composed of the 1:2 serial-parallel conversion section 401 or 401A in the first stage and the first and second serial-parallel conversion sections 411 and 412 in the second stage. However, three or more stage structure may be employed by the serial-parallel converter 400. By connecting a plurality of serial-parallel conversion sections in multi-stage structure, each of which has a plurality of serial-parallel conversion ratios, advantageous effects can be obtained that the design workload can be further reduced and a high-speed operation can be achieved even when a circuit that can operate at a relatively low speed is employed as a part of the serial-parallel converter.

3. Third Embodiment

3.1) Outline of Circuit

Figure 13:
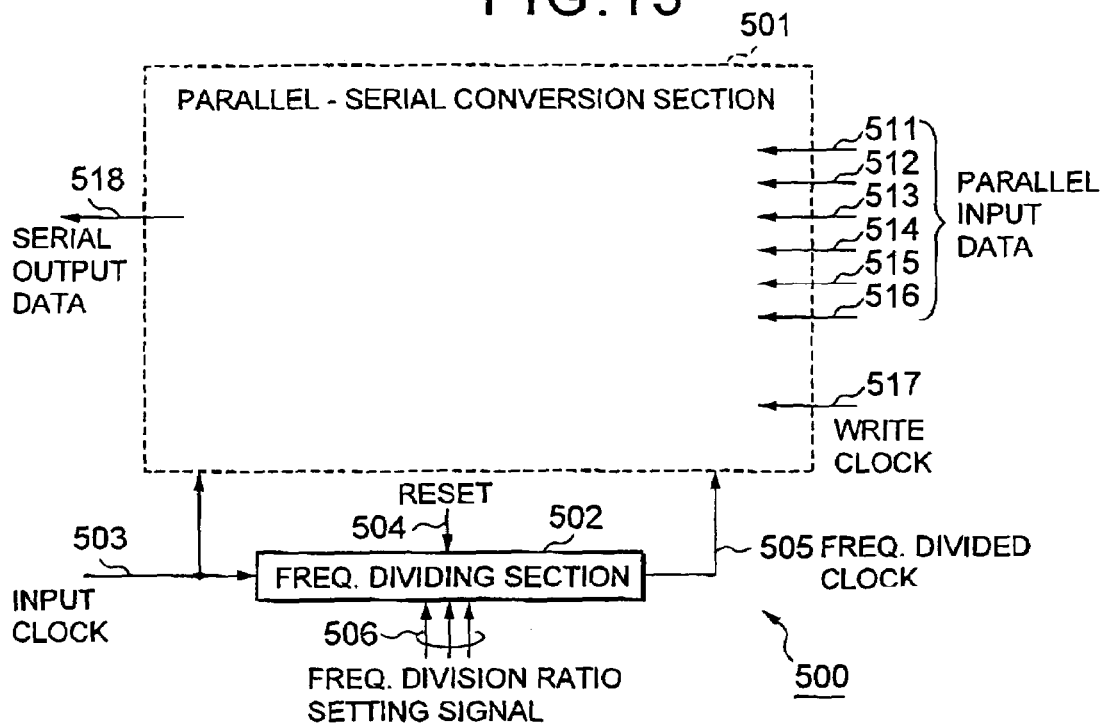
FIG. 13 is a schematic diagram showing a parallel-serial converter according to a third embodiment of the present invention.

Referring to FIG. 13, a parallel-serial converter 500 according to a third embodiment of the present invention includes a parallel-serial conversion section 501 and a frequency dividing section 502. As the frequency dividing section 502, the frequency dividing section 302 or 302A shown in FIG. 2 or 3 in the first example may be used. An input clock 503 is supplied to both the frequency dividing section 502 and the parallel-serial conversion section 501. When a reset signal 504, which corresponds to the reset signal 347 in FIG. 1, is changed from "1" to "0," the frequency dividing section 502 starts frequency division of the input clock 503 (see the input clock. 328 shown in FIGS. 4(b), 5(b), and 6(b)), thereby outputting a frequency-divided clock 505 (corresponding to the output clock 337 of the first example shown in FIGS. 4(d), 5(d), and 6(d)). The frequency-divided clock 505 is then supplied to the parallel-serial conversion section 501. The parallel-serial conversion section 501 receives the input parallel data 511–516 according to a write clock 517 and converts them into serial data, which is output as output data 518.

3.2) Example

Figure 14:
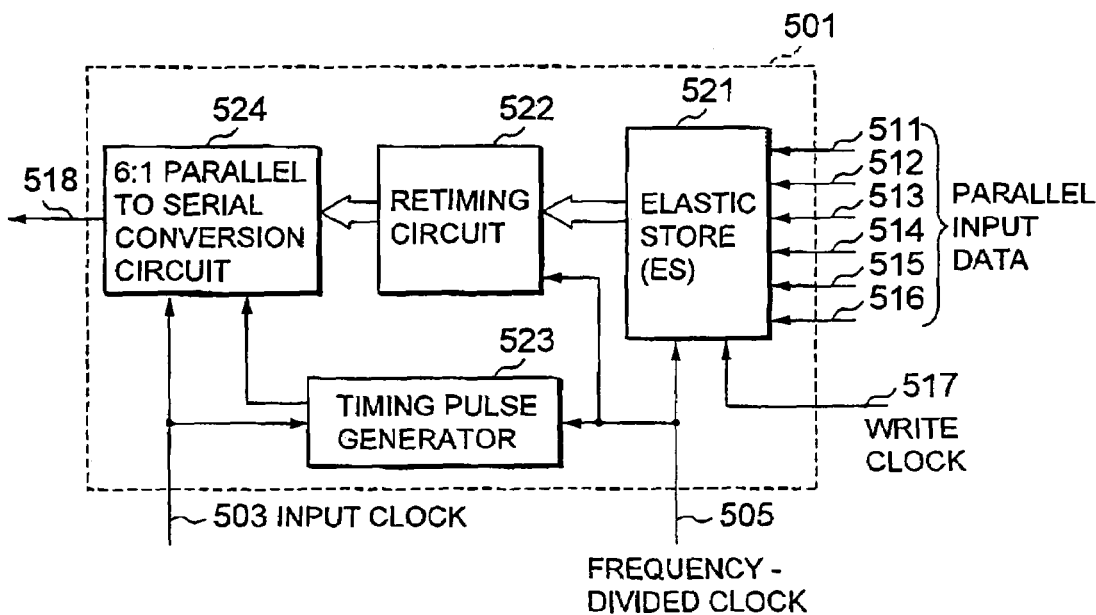
FIG. 14 is a block diagram showing an exemplary circuit structure of a parallel-serial conversion section in the third embodiment.

Referring to FIG. 14, an example of the parallel-serial conversion section 501 includes an elastic store (ES) circuit 521, a retiming circuit 522 that changes a timing of data, a timing pulse generator 523, and a 6:1 parallel-serial conversion circuit 524. Such a basic circuit structure of this example has been disclosed in the Japanese Patent Laid-Open Publication No. 8-65173 described as a prior art in the disclosure.

The elastic store (ES) circuit 521 writes the 6-bit input parallel data 511–516 according to the write clock 517 and reads them according to the frequency-divided clock 505 supplied as a read clock by the frequency dividing section 502. The read parallel data is subjected to retiming by the retiming circuit 522 using the frequency-divided clock 505 and the retimed parallel data is output to the 6:1 parallel-serial conversion circuit 524. The timing pulse generator 523 generates a parallel-serial conversion timing pulse using the input clock 503 and the read clock 505. The 6:1 parallel-serial conversion circuit 524 uses the parallel-serial conversion timing pulse and the input clock 503 to convert the retimed parallel data into the serial data 518.

3.3) Parallel-serial Conversion

Figure 15:
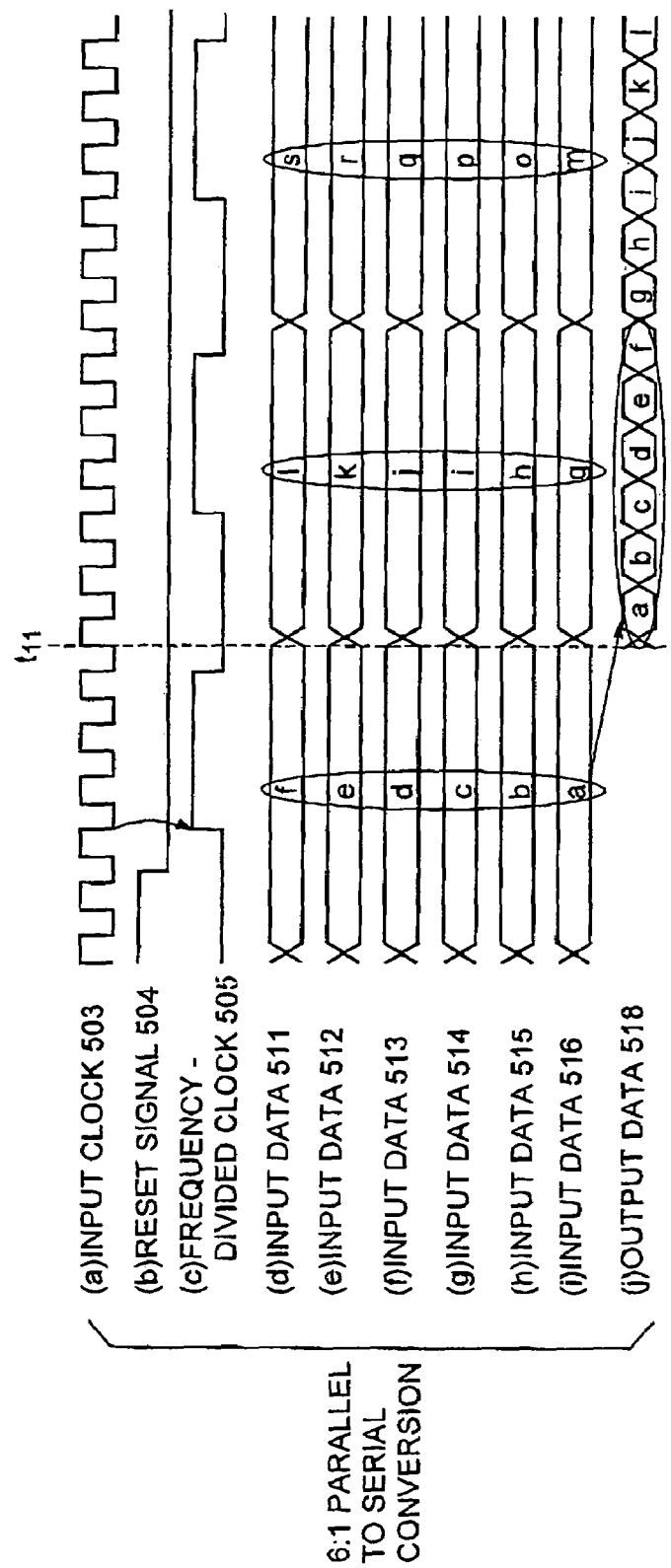
FIG. 15 is a timing chart showing 6:1 parallel-serial conversion of the parallel-serial converter according to the third embodiment.
Figure 16:
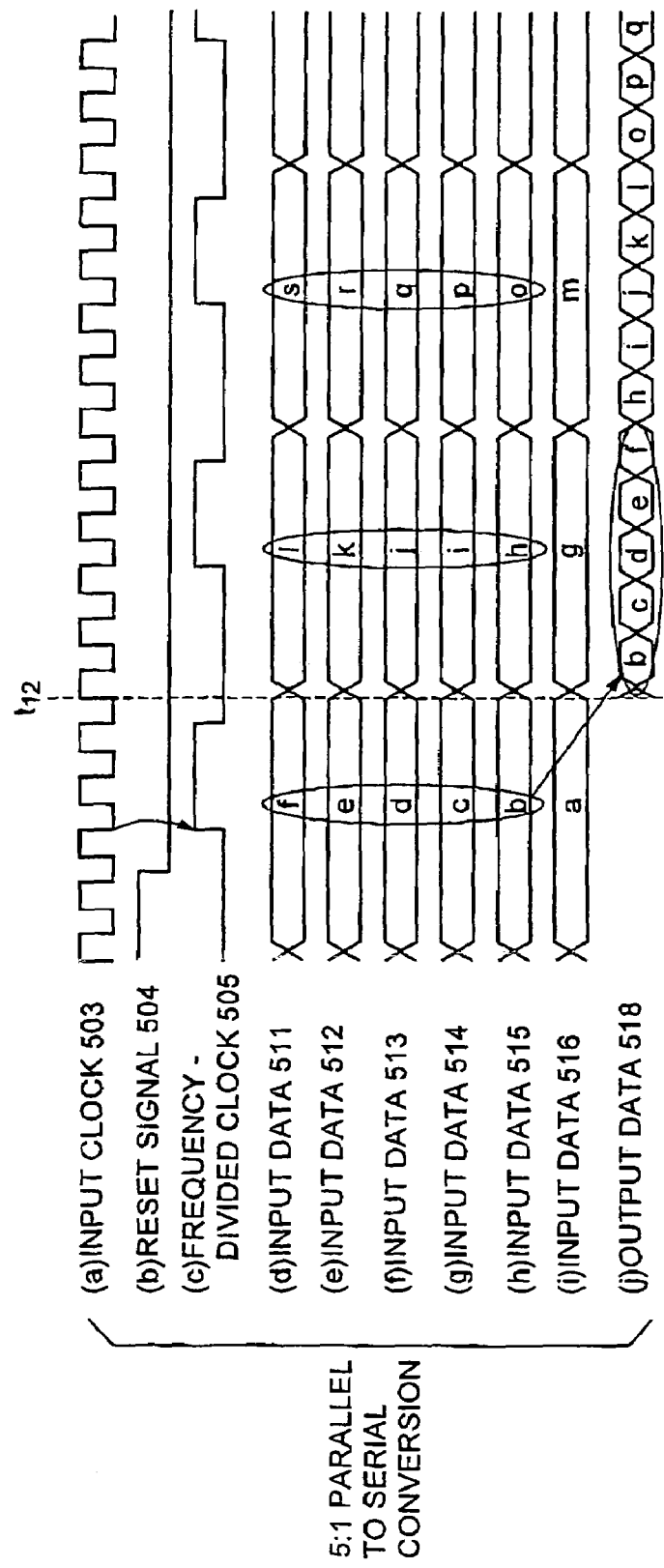
FIG. 16 is a timing chart showing 5:1 parallel-serial conversion of the parallel-serial converter according to the third embodiment.
Figure 17:
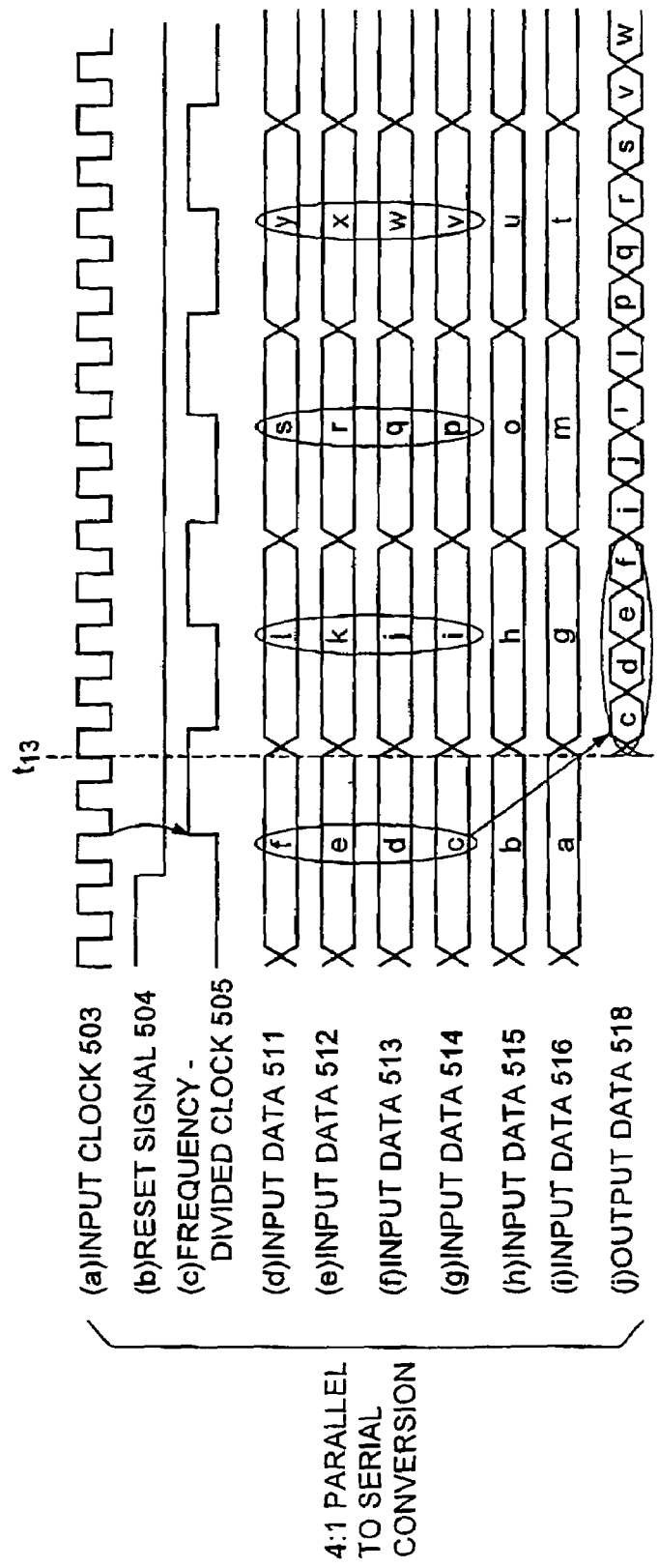
FIG. 17 is a timing chart showing 4:1 parallel-serial conversion of the parallel-serial converter according to the third embodiment.

FIGS. 15–17 show parallel-serial conversion operations of the parallel-serial converter 500 according to the example as shown in FIG. 14. FIG. 15 shows 6:1 parallel-serial conversion in the case where the frequency-division ratio of the frequency dividing section 502 is set to 6. FIG. 16 shows 5:1 parallel-serial conversion in the case where the frequency-division ratio of the frequency dividing section 502 is set to S. FIG. 17 shows 4:1 parallel-serial conversion in the case where the frequency-division ratio of the frequency dividing section 502 is set to 4.

It is assumed that the frequency-divided clock 505 shown in FIGS. 15(c), 16(c), and 17(c) has the same timing as the output clock 337 shown in FIGS. 4(d), 5(d), and 6(d), respectively. Next, an overall operation of the parallel-serial converter 500 as shown in FIG. 13 will be described.

Referring to FIG. 15, in the case of performing 6:1 parallel-serial conversion, timings of input data 511–516 (FIG. 15(d)–(i)) are arranged on the rising edge of the frequency-divided clock 505 (FIG. 15(c)), and thereafter the input data 511–516 are sequentially converted into serial data from a time t11 corresponding to the next rising edge of input clock 503 after the frequency-divided clock 505 has fallen in synchronization with the input clock 503. In FIG. 15, it is assumed that the input data 511, 512, 513, 514, 515, and 516 are "f," "e," "d," "c," "b," and "a," respectively. They are converted into serial data containing data units "a," "b," "c," "d," "e," and "f" in that order from the time t11.

Referring to FIG. 16, in the case of 5:1 parallel-serial conversion, timings of the input data 511–515 (FIG. 16(d) –(h)) are arranged on the rising edge of the frequency-divided clock 505 (FIG. 15(c)), and thereafter the input data 511–515 are sequentially converted into serial data from a time t12 corresponding to the next rising edge of the input clock 503 (FIG. 16(a)) after the frequency-divided clock 505 has fallen in synchronization with the input clock 503. In FIG. 16, it is assumed that the input data 511, 512, 513, 514 and 515 are "f," "e," "d," "c," and "b," respectively. They are sequentially converted into serial data containing the data units "b," "c," "d," "e," and "f" in that order from the time t12.

Referring to FIG. 17, in the case of 4:1 parallel-serial conversion, timings of the input data 511–514 (FIG. 17(d) –(g) are arranged on the rising edge of the frequency-divided clock 505 (FIG. 17(c)), and thereafter the input data 511–514 are sequentially converted into serial data from a time t13 in the case of the frequency-divided clock 505 being held high, in synchronization with the input clock 503. In FIG. 17, it is assumed that the input data 511, 512, 513, and 514 are "f," "e," "d," and "c," respectively. They are converted into serial data containing data units "c," "d," "e," and "f" in that order from the time t13.

As described above, according to the third embodiment the frequency dividing section 502 having the frequency-division ratio that can be changed in accordance with the frequency-division ratio setting signal 506 is applied to a parallel-serial converter. Thus, only by designing a single parallel-serial converter, it is operable in various cases where the number of bits of parallel data is different. Therefore, it is unnecessary to design different parallel-serial converters for the different number of bits of parallel data, thus reducing the design workload largely.

Moreover, the parallel-serial converter 500 according to the third embodiment has a simple structure that can operate with the input clock 503 and the frequency-divided clock S05 only. Thus, the design of the parallel-serial converter 500 can be done easily.

4. Fourth Embodiment

4.1) Outline of Circuit

Figure 18:
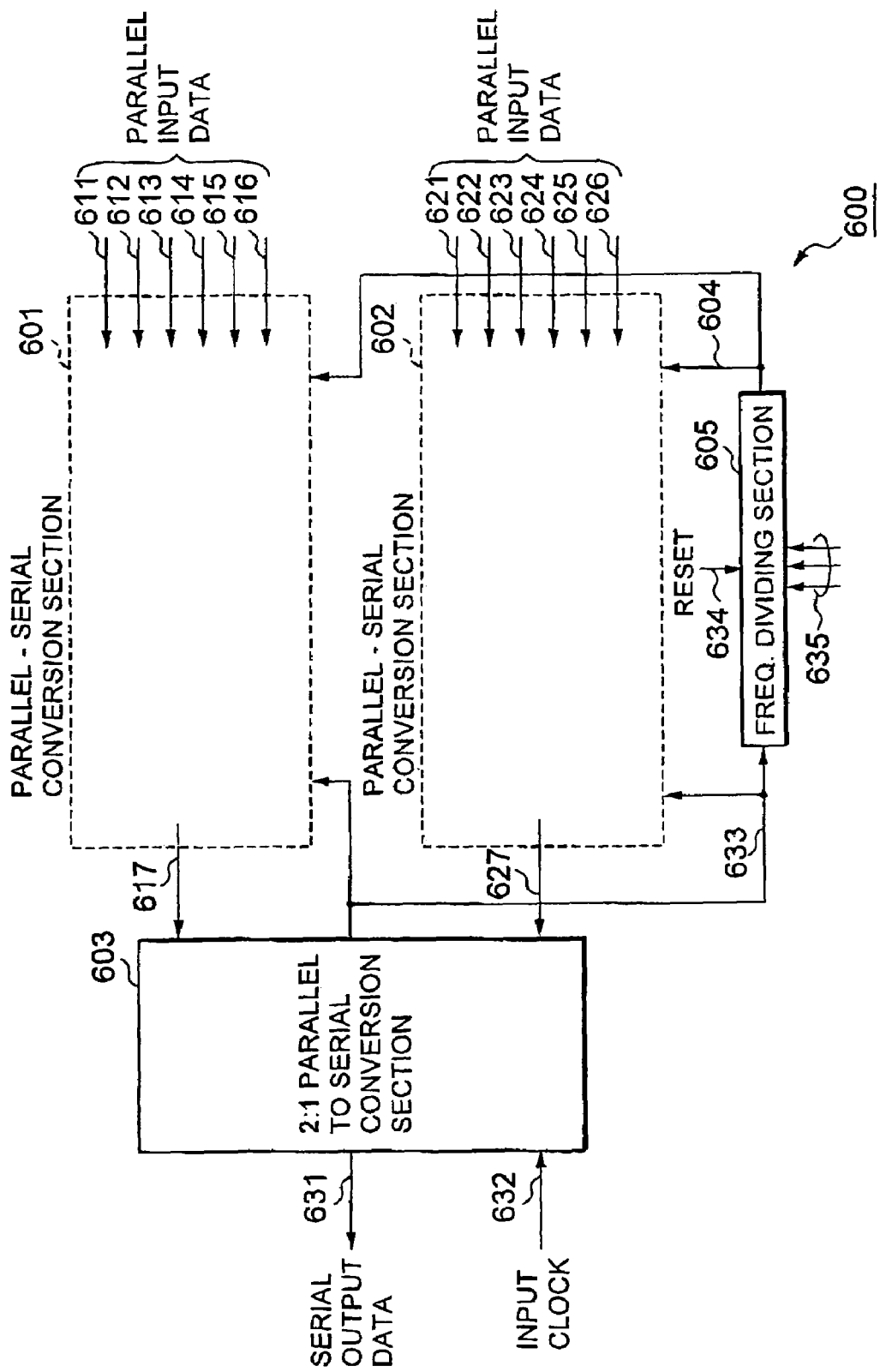
FIG. 18 is a schematic diagram showing a parallel-serial converter according to a fourth embodiment of the present invention.

Referring to FIG. 18, a parallel-serial converter 600 according to a fourth embodiment of the present invention includes first and second parallel-serial conversion sections 601 and 602, a 2:1 parallel-serial conversion section 603, and a frequency dividing section 605.

The first parallel-serial conversion section 601 receives input parallel data 611–616, converts them to first serial data 617, and supplies the first serial data 617 to the 2:1 parallel-serial conversion section 603. Similarly, the second parallel-serial conversion section 602 receives input parallel data 621–626, converts them into second serial data 627, and then supplies the second serial data 627 to the 2:1 parallel-serial conversion section 603. The 2:1 parallel-serial conversion section 603 receives the first and second serial data 617 and 627 as 2-bit parallel data, converts them into serial data, and outputs the thus obtained serial data as output data 631. The 2:1 parallel-serial conversion section 603 also receives an input clock 632 and supplies a clock 633 to the first and second parallel-serial conversion sections 601 and 602 and the frequency dividing section 605. The frequency dividing section 605 is reset by a reset signal 634, and divides the clock 633 at a frequency-division ratio set by the frequency-division ratio setting signal 635 so as to output a frequency-divided clock 604. The frequency dividing section 605 supplies the frequency-divided clock 604 to the first and second parallel-serial conversion sections 601 and 602.

Each of the first and second parallel-serial conversion sections 601 and 602 may be constructed using the same circuit as the parallel-serial conversion section 501 of the third embodiment as shown in FIG. 14. Moreover, as the frequency dividing section 605, the same circuit as the frequency dividing section 302 or 302A of the first embodiment as shown in FIG. 2 or 3 may be employed. Therefore, detailed circuit structures of the first and second parallel-serial conversion sections 601 and 602 and the frequency dividing section 605 are not shown in FIG. 18 and the descriptions thereof are omitted.

4.2) First Example

Figure 19:
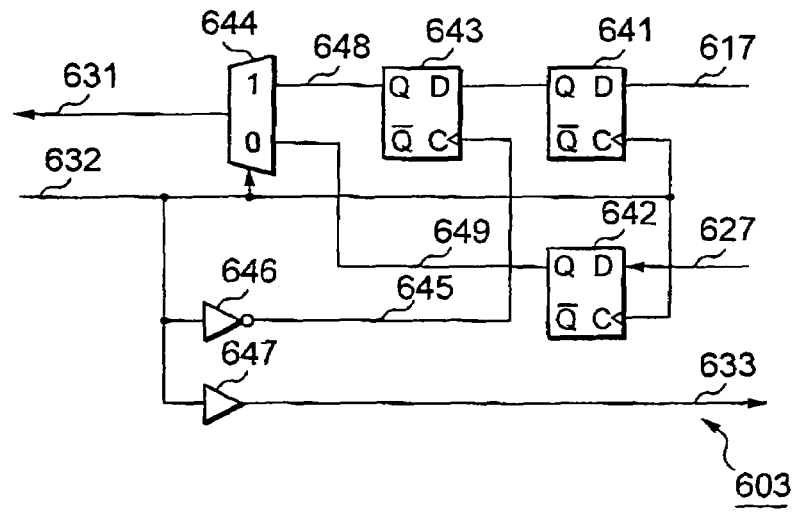
FIG. 19 is a circuit diagram showing an example of a 2:1 parallel-serial conversion section in the parallel-serial converter of the fourth embodiment.

As shown in FIG. 19, the 2:1 parallel-serial conversion section 603 includes a first flip-flop circuit 641 that receives the first serial data 617 at its data input terminal D, a second flip-flop circuit 642 that receives the second serial data 627 at its data input terminal D, a third flip-flop circuit 643 connected its data input terminal D to an output terminal Q of the first flip-flop circuit 641, a selector 644 with its first input terminal labeled "1" connected to an output terminal Q of the third flip-flop circuit 643 and its second input terminal labeled "0" connected to an output terminal Q of the second flip-flop circuit 642, an inverter 646 that inverts the logic of the input clock 632 and supplies the inverted input clock 645 to a clock input terminal C of the third flip-flop circuit 643, and a delay circuit 647 that receives the input clock 632 and delays it by a predetermined time to output the clock 633.

The input clock 632 is also supplied to a select terminal of the selector 644 and clock input terminals C of the first and second flip-flop circuits 641 and 642. The selector 644 selects one of the output data 648 of the third flip-flop circuit 643 and the output data 649 of the second flip-flop circuit 642 depending on a state of the input clock 632, to output the selected data as output data 631.

Figure 20:
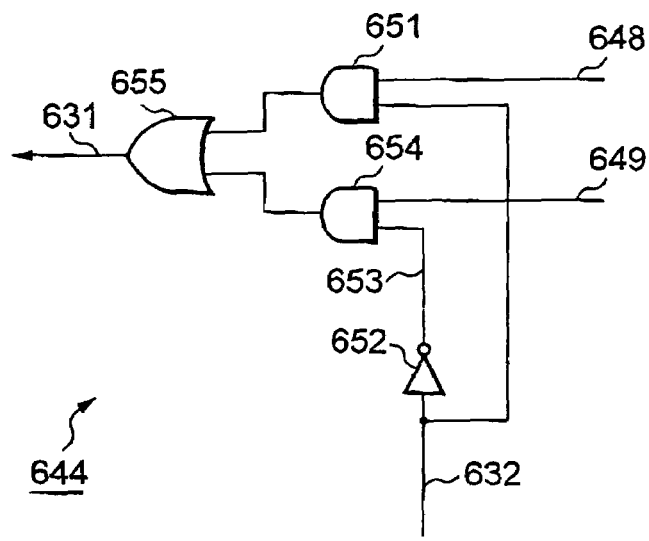
FIG. 20 is a circuit diagram showing an exemplary circuit structure of a selector as shown in FIG. 19.

As shown in FIG. 20, the selector 644 includes a first AND circuit 651 that obtains AND of the input clock 632 and the data 648, a second AND circuit 654 that obtains AND of the data 649 and the inverted clock 653 obtained by inverting the input clock 632 with the inverter 652, and an OR circuit 655 that obtains OR of outputs of the first and second AND circuits 651 and 654. The OR circuit 655 outputs the output data 631.

Figure 21:
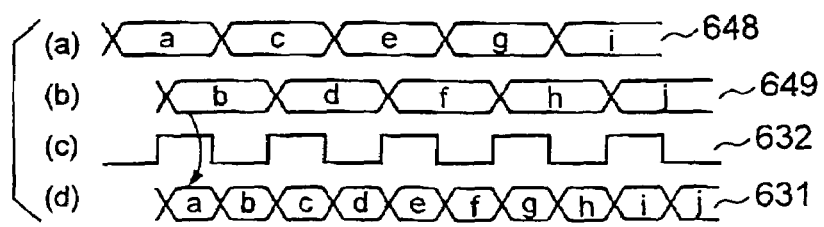
FIG. 21 is a timing chart showing a selection operation of the selector as shown in FIG. 20.

Referring to FIG. 21, (a) represents data 648 input to the selector 644 (FIG. 20), while (b) represents the other data 649 input thereto. As shown in FIG. 21(c), when the input clock 632 is "1," the data 648 is selected and output as the output data 631. When the input clock 632 is "0," the other data 649 is selected and output as the output data 631.

4.3) Second Example

Figure 22:
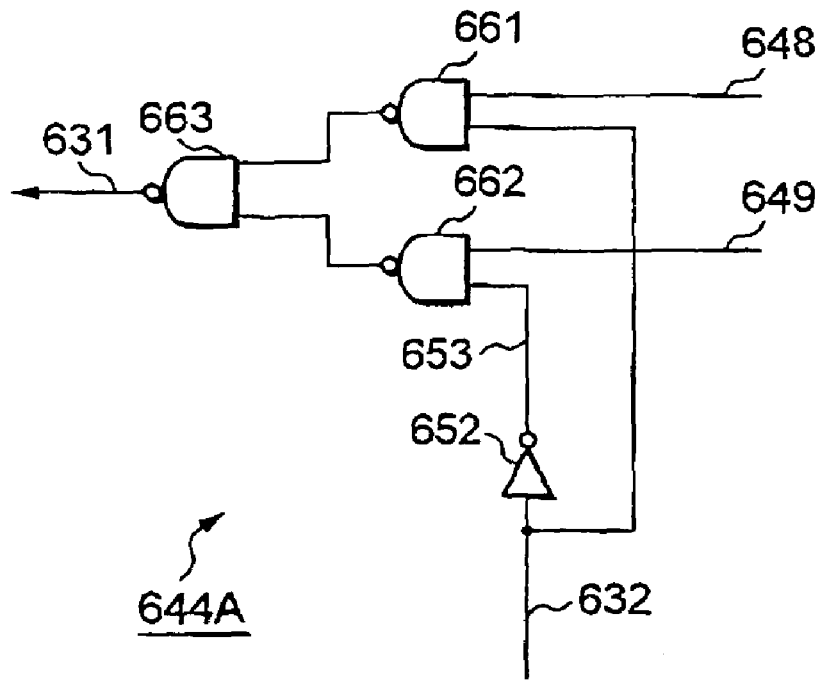
FIG. 22 is a circuit diagram showing another example of the selector as shown in FIG. 20.

FIG. 22 shows another example of the selector that can operate in a manner as shown in FIG. 21. Logical gates and signals similar to those previously described with reference to FIG. 20 are denoted by the same reference numerals, and the descriptions thereof are omitted.

In a selector 644A as shown in FIG. 22, the first and second AND circuits 651 and 654 of the selector 644 in FIG. 20 are replaced with first and second NAND circuits 661 and 662. The OR circuit 655 in FIG. 20 is also replaced with a third NAND circuit 663. One of the data 648 and 649 is selected and output from the third NAND circuit 663 as the output data 631.

Since the parallel-serial converter 600 of the fourth embodiment as shown in FIG. 18 is configured as described above, each of the first and second parallel-serial conversion sections 601 and 602 converts a corresponding one of the input parallel data 611–616 and 621–626 into serial data 617 or 627. Then, the 2:1 parallel-serial conversion section 603 receives the serial data 617 and 627 as parallel data to convert it into the serial output data 631. That is, parallel data is converted into serial data in a two-stage structure. Thus, each of the first and second parallel-serial conversion sections 601 and 602 in the first stage can be formed by a circuit operating at a relatively low speed Moreover, the 2:1 parallel-serial conversion section 603 in the second stage can be formed by a simple circuit. Therefore, it is easy to operate the 2:1 parallel-serial conversion section 603 at high speed.

Figure 23:
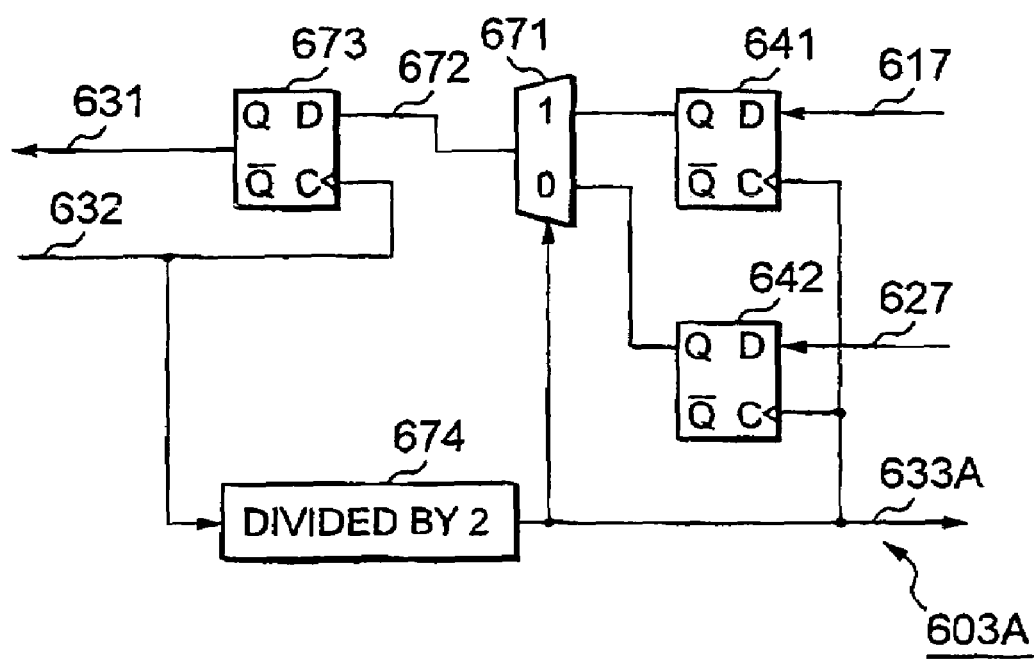
FIG. 23 is a circuit diagram showing another example of the 2:1 parallel-serial conversion section in the parallel-serial converter of the fourth embodiment.

FIG. 23 shows another example of the 2:1 parallel-serial conversion section that can be used in the parallel-serial converter of the fourth embodiment. Logical components and signals similar to those previously described with reference to FIG. 19 are denoted by the same reference numerals, and the descriptions thereof are omitted.

In the 2:1 parallel-serial conversion section 603A as shown in FIG. 23, a selector 671 selects one of two output data appearing on the output terminals D of the first and second flip-flop circuits 641 and 642 depending on a frequency-divide clock 633A obtained by a 1/2 frequency divider 674. The selected output data 672 is output to a data input terminal D of the third flip-flop circuit 673. The input clock 632 is supplied to a clock input terminal C of the third flip-flop circuit 673, and is also supplied to the 1/2 frequency divider 674 where the input clock 632 is divided by 2. The frequency-divided clock is supplied as a clock 633A to a select terminal of the selector 671 and the clock input terminals C of the first and second flip-flop circuits 641 and 642.

In the 2:1 parallel-serial conversion section 603 shown in FIG. 19, the data 648 obtained by changing timings of the data 617 through the first and third flip-flop circuits 641 and 643 is selected and output when the input clock 632 is "1", while the data 649 obtained by changing timings of the data 627 through the second flip-flop circuit 642 is selected and output when the input clock 632 is "0." The frequency of the input clock 632 is a half that of the output data 631.

On the other hand, in the 2:1 parallel-serial conversion section 603A as shown in FIG. 23, the timings of the data 617 and 627 that are parallel are changed with the clock 633A obtained by dividing the input clock 632 by two, and then the result of selection using this clock 633A is output as the output data 631 after its timing has been retimed using the input clock 632. Accordingly, the frequency of the input clock 632 is equal to that of the output data 631.

As described above, the parallel-serial converter 600 according to the fourth embodiment has such a structure that the first and second parallel-serial conversion sections 601 and 602 output data having a rate that is a half of the rate of the output data 631. Thus, it is enough that only the 2:1 parallel-serial conversion section 603 having a simple structure can handle high-speed output data 631. Therefore, an advantageous effect can be obtained that the entire parallel-serial converter 600 can be operated at a high speed.

In the fourth embodiment as shown in FIG. 18, the 2:1 parallel-serial conversion section 603 is used at the final stage to produce the serial output data 631.

A modified embodiment can be provided by employing a parallel-serial converter having a conversion ratio n:1 other than the ratio of 2:1. In this modified case, a multi-phase input clock, instead of the input clock 632 shown in FIG. 19, may be used to select data to output the serial data 631. Moreover, the n:1 parallel-serial converter may perform parallel-serial conversion at a conversion ratio selected from a plurality of conversion ratios depending on selection control input from outside.

In the fourth embodiment, the parallel-serial converter 600 has a two-stage structure composed of the first and second serial-parallel conversion section 601 and 602 in the first stage and the 2:1 parallel-serial conversion section 603 in the second stage. However, three or more-stage structure may be employed by the parallel-serial converter 600. By connecting a plurality of serial-parallel conversion sections in multi-stage structure, each of which has a plurality of serial-parallel conversion ratios, advantageous effects can be obtained that the design workload can be further reduced and a high-speed operation can be achieved.

As described above, in the above embodiment or modified embodiments, the frequency divider divides the input high-speed clock to produce a single frequency-divided clock. The serial-parallel or parallel-serial converter according to the present invention operates according to the frequency-divided clock and the input high-speed clock only. Therefore, it is easy to design the serial-parallel or parallel-serial converter.

Furthermore, in the serial-parallel converter according to the above embodiments, the frequency dividing section has a reset terminal, which inputs the reset signal. Thus, with the addition of a synchronization pattern detection section that generates the reset signal when an input pattern of serial data matches a synchronization pattern, it is possible to output the synchronization pattern included in output parallel data.

In addition, in the above examples and modified example, an individual circuit such as a flip-flop circuit, AND circuit, OR circuit is assumed to be a single-ended circuit. However, these individual circuits may be formed as a differential circuit.

The invention claimed is:

1. A serial-to-parallel converter for converting serial input data to parallel output data, wherein the serial input data is synchronized with an input clock, comprising:
    a frequency divider for dividing the input clock in frequency at a variable frequency division ratio to produce a single frequency-divided clock;
    a serial-to-parallel conversion section for converting the serial input data to n-bit parallel data, where n is an integer greater than 1, which is determined depending on the variable frequency division ratio;
    a synchronizing section for synchronizing the n-bit parallel data with the single frequency-divided clock to output the parallel output data; and
    a pattern detector for detecting a predetermined pattern of bits from the n-bit serial input data stored in the data shift circuit, wherein the predetermined pattern detector generates a reset signal when the predetermined pattern of bits has been found,
    wherein the frequency divider is reset to start its frequency dividing operation when the reset signal is generated, causing the synchronizing section to output the parallel output data including the predetermined pattern of bits.

2. The serial-to-parallel converter according to claim 1, wherein the serial-to-parallel conversion section is a data shift circuit for shifting the serial input data according to the input clock to store n-bit serial input data and outputting the n-bit serial input data in parallel to the synchronizing section.

3. A serial-to-parallel converter for converting serial input data to parallel output data, wherein the serial input data is synchronized with an input clock, comprising:
    a first-stage serial-to-parallel conversion section for converting the serial input data to N-bit parallel data synchronized with a first-stage clock generated from the input clock, where N is an integer greater than 1;
    a frequency divider for dividing the first-stage clock in frequency at a variable frequency division ratio to produce a single frequency-divided clock;
    N second-stage serial-to-parallel conversion sections each receiving N bit sequences of the N-bit parallel data, wherein each of the N second-stage serial-to-parallel conversion sections converts a corresponding bit sequence to M-bit parallel data, where M is an integer greater than 1, which is determined depending on the variable frequency division ratio,
    wherein each of the N second-stage serial-to-parallel conversion sections comprises a synchronizing section for synchronizing the M-bit parallel data with the single frequency-divided clock, thereby outputting N×M-bit synchronized parallel data as the parallel output data.

4. The serial-to-parallel converter according to claim 3, wherein the first-stage serial-to-parallel conversion section is a 1:2 serial-to-parallel conversion section which divides the serial input data into two bit sequences according to timing of both rising and falling edges of the input clock, wherein the first-stage clock is generated by delaying the input clock by a predetermined time.

5. The serial-to-parallel converter according to claim 3, wherein the first-stage serial-to-parallel conversion section is a 1:2 serial-to-parallel conversion section, which comprises a 1/2 frequency divider for dividing the input clock in frequency by 2 to produce the first-stage clock, wherein the 1:2 serial-to-parallel conversion section divides the serial input data into two bit sequences according to the input clock and the first-stage clock.

6. The serial-to-parallel converter according to claim 3, wherein N is equal to or greater than 3, wherein the input clock is a multiphase clock which is used to divide the serial input data into N bit sequences.

7. The serial-to-parallel converter according to claim 1, wherein the serial-to-parallel conversion section operates in differential mode.

8. A serial-to-parallel converter for converting serial input data to parallel output data, wherein the serial input data is synchronized with an input clock, comprising:
    a first serial-to-parallel conversion section for converting the serial input data to N-bit parallel data synchronized with a first clock generated from the input clock, where N is an integer greater than 1; and
    a plurality of serial-to-parallel conversion sections arranged in a multistage tree structure, wherein each serial-to-parallel conversion section included in each stage receives a corresponding bit sequence of parallel data produced by a previous serial-to-parallel conversion section included in a previous stage and converts the corresponding bit sequence to parallel data to output each bit sequence of the parallel data to a different subsequent serial-to-parallel conversion section included in a subsequent stage, thereby a plurality of final-stage serial-to-parallel conversion sections outputting the parallel output data, wherein each stage comprises:

a frequency divider for dividing a previous-stage first clock in frequency at a variable frequency division ratio to produce a current-stage first clock; and a plurality of serial-to-parallel conversion sections, each of which comprises:

a data shifter for shifting the serial input data to produce n-bit parallel data, where n is an integer greater than 1, which is determined depending on the variable frequency division ratio; and a synchronizing section for synchronizing the n-bit parallel data with the current-stage first clock to produce current-stage parallel data, wherein each bit sequence of the current-stage parallel data is output to a corresponding serial-to-parallel conversion section included in a subsequent stage.

9. A parallel-to-serial converter for converting parallel input data to serial output data, wherein the serial output data is synchronized with an output sync clock, comprising:

a frequency divider for dividing a sync clock in frequency at a variable frequency division ratio to produce a single frequency-divided clock, wherein the sync clock is generated from the output sync clock;

a plurality of first parallel-to-serial conversion sections, each of which converts a different group of parallel bits of the parallel input data to produce a bit sequence; and a second parallel-to-serial conversion section for converting bit sequences each received from the plurality of first parallel-to-serial conversion sections according to the sync clock to output the serial output data according to the output sync clock, wherein each of the first parallel-to-serial conversion sections comprises:

a parallel-data storage for storing a corresponding group of parallel bits of the parallel input data;

a parallel-data reader for reading n-bit parallel data from the parallel-data storage according to the single frequency-divided clock, where n is an integer greater than 1, which is determined depending on the variable frequency division ratio; and a parallel-to-serial conversion section for converting the n-bit parallel input data to the bit sequence according to the sync clock.

10. The parallel-to-serial converter according to claim 9, wherein the second parallel-to-serial conversion section is a 2:1 parallel-to-serial conversion section which converts two bit sequences received from two first parallel-to-serial conversion sections to output the serial output data according to timing of both rising and falling edges of the output sync clock, wherein the sync clock is generated by delaying the output sync clock by a predetermined time.

11. The parallel-to-serial converter according to claim 9, wherein the second parallel-to-serial conversion section is a 2:1 parallel-to-serial conversion section, which comprises a 1/2 frequency divider for dividing the output sync clock in frequency by 2 to produce the sync clock, wherein the 2:1 parallel-to-serial conversion section combines two first bit sequences received from two first parallel-to-serial conversion sections to output the serial output data according to the output sync clock and the sync clock.

12. The parallel-to-serial converter according to claim 9, wherein the output sync clock is a multiphase clock which is used to combines the bit sequences each received from the plurality of first parallel-to-serial conversion sections to output the serial output data.

13. The parallel-to-serial converter according to claim 9, wherein the parallel-to-serial conversion section operates in differential mode.

14. A parallel-to-serial converter for converting parallel input data to serial output data, wherein the serial output data is synchronized with an output sync clock, comprising:

a plurality of parallel-to-serial conversion sections arranged in a multistage tree structure such that each parallel-to-serial conversion section included in each stage receives previous bit sequences from corresponding previous-stage parallel-to-serial conversion sections to convert them to a bit sequence, which is output to a corresponding parallel-to-serial conversion section included in a subsequent stage; and a final parallel-to-serial conversion section for converting bit sequences each received from a plurality of previous-stage parallel-to-serial conversion sections to output the serial output data, wherein each stage comprises:

a frequency divider for dividing a subsequent-stage read sync clock in frequency at a variable frequency division ratio to produce a current-stage read sync clock, wherein the subsequent-stage sync clock is a read sync clock generated in a subsequent stage; and a plurality of parallel-to-serial conversion sections, each of which comprises:

a parallel-data storage for storing previous bit sequences from the corresponding previous-stage parallel-to-serial conversion sections;

a parallel-data reader for reading n-bit parallel data from the parallel-data storage according to the current-stage read sync clock, where n is an integer greater than 1, which is determined depending on the variable frequency division ratio; and a parallel-to-serial conversion section for converting the n-bit parallel data to the bit sequence according to the subsequent-stage read sync clock.

* * * * *